(12) United States Patent
Wang et al.

(10) Patent No.: US 11,817,839 B2
(45) Date of Patent: Nov. 14, 2023

(54) SINGLE-CRYSTAL BULK ACOUSTIC WAVE RESONATOR AND METHOD OF MAKING THEREOF

(71) Applicant: Global Communication Semiconductors, LLC, Torrance, CA (US)

(72) Inventors: Shing-Kuo Wang, Torrance, CA (US); Liping Daniel Hou, Torrance, CA (US); Yuefei Yang, Torrance, CA (US)

(73) Assignee: GLOBAL COMMUNICATION SEMICONDUCTORS, LLC, Torrance, CA (US)

( * ) Notice: Subject to any disclaimer, the term of this patent is extended or adjusted under 35 U.S.C. 154(b) by 0 days.

(21) Appl. No.: 17/002,498

(22) Filed: Aug. 25, 2020

(65) Prior Publication Data

US 2020/0389150 A1 Dec. 10, 2020

Related U.S. Application Data

(63) Continuation-in-part of application No. 16/368,754, filed on Mar. 28, 2019.

(51) Int. Cl.
H03H 9/17 (2006.01)
H03H 9/13 (2006.01)
H03H 9/02 (2006.01)

(52) U.S. Cl.
CPC ........ *H03H 9/175* (2013.01); *H03H 9/02015* (2013.01); *H03H 9/131* (2013.01); *H03H 9/176* (2013.01)

(58) Field of Classification Search
CPC .... H03H 9/175; H03H 9/02015; H03H 9/131; H03H 9/176; H03H 9/174;
(Continued)

(56) References Cited

U.S. PATENT DOCUMENTS

| 4,320,365 A | 3/1982 | Black et al. |
| 5,448,014 A | 9/1995 | Kong et al. |

(Continued)

FOREIGN PATENT DOCUMENTS

| JP | 2016140053 A | 8/2016 |
| TW | 200610266 A | 3/2006 |
| WO | WO2020132997 A1 | 7/2020 |

OTHER PUBLICATIONS

Yoo et al., Spurious Resonances and Modelling of Composite Resonators, Department of Physics, The Catholic University of America, Washington, D.C., © 1983 IEEE, 3 pgs.
(Continued)

*Primary Examiner* — Rakesh B Patel
*Assistant Examiner* — Jorge L Salazar, Jr.
(74) *Attorney, Agent, or Firm* — Morgan, Lewis & Bockius LLP

(57) ABSTRACT

A single-crystal bulk acoustic wave resonators with better performance and better manufacturability and a process for fabricating the same are described. A low-acoustic-loss layer of one or more single-crystal and/or poly-crystal piezoelectric materials is epitaxially grown and/or physically deposited on a surrogate substrate, followed with the formation of a bottom electrode and then a support structure on a first side of the piezoelectric layer. The surrogate substrate is subsequently removed to expose a second side of the piezoelectric layer that is opposite to the first side. A top electrode is then formed on the second side of the piezoelectric layer, followed by further processes to complete the BAW resonator and filter fabrication using standard wafer processing steps. In some embodiments, the support structure has a cavity or an acoustic mirror adjacent the first electrode layer to minimize leakage of acoustic wave energy.

12 Claims, 28 Drawing Sheets

(58) Field of Classification Search
CPC ....... H03H 2003/023; H03H 2003/025; H03H 9/173; H03H 2003/021; H03H 3/02
USPC ........................................ 333/133, 187, 188
See application file for complete search history.

(56) References Cited

U.S. PATENT DOCUMENTS

| | | | |
|---|---|---|---|
| 5,578,974 | A | 11/1996 | Yang et al. |
| 5,587,620 | A | 12/1996 | Ruby et al. |
| 5,873,153 | A | 2/1999 | Ruby et al. |
| 5,894,647 | A | 4/1999 | Lakin |
| 6,060,818 | A | 5/2000 | Ruby et al. |
| 6,150,703 | A | 11/2000 | Cushman et al. |
| 6,262,637 | B1 | 7/2001 | Bradley et al. |
| 6,278,342 | B1* | 8/2001 | Ella ....................... H03H 9/568 333/191 |
| 6,424,237 | B1 | 7/2002 | Ruby et al. |
| 6,693,500 | B2 | 2/2004 | Yang et al. |
| 6,767,749 | B2* | 7/2004 | Kub ..................... H10N 30/072 438/48 |
| 6,828,713 | B2 | 12/2004 | Bradley et al. |
| 7,327,073 | B2 | 2/2008 | Shearer et al. |
| 7,345,410 | B2 | 3/2008 | Grannen et al. |
| 7,408,428 | B2 | 8/2008 | Larson, III |
| 7,522,018 | B2 | 4/2009 | Milsom et al. |
| 7,737,806 | B2 | 6/2010 | Taniguchi et al. |
| 8,896,395 | B2 | 11/2014 | Burak et al. |
| 9,197,185 | B2 | 11/2015 | Zou et al. |
| 9,246,079 | B2 | 1/2016 | Umeda et al. |
| 9,246,473 | B2* | 1/2016 | Burak .................. H03H 9/02118 |
| 9,374,059 | B1* | 6/2016 | Hurwitz .................. H03H 3/02 |
| 9,401,692 | B2* | 7/2016 | Burak ................ H03H 9/02157 |
| 9,479,139 | B2 | 10/2016 | Ruby et al. |
| 9,634,643 | B2 | 4/2017 | Shin et al. |
| 9,842,980 | B2 | 12/2017 | Park et al. |
| 10,079,334 | B2 | 9/2018 | Moulard et al. |
| 10,298,197 | B2 | 5/2019 | Lee et al. |
| 10,601,391 | B2 | 3/2020 | Stokes et al. |
| 11,736,088 | B2 | 8/2023 | Stokes et al. |
| 2005/0012568 | A1* | 1/2005 | Aigner .................. H03H 9/178 333/187 |
| 2005/0179508 | A1 | 8/2005 | Sato |
| 2007/0001544 | A1 | 1/2007 | Geefay |
| 2010/0019866 | A1 | 1/2010 | Hara et al. |
| 2010/0148637 | A1 | 6/2010 | Satou |
| 2011/0080233 | A1 | 4/2011 | Petit et al. |
| 2011/0227671 | A1 | 9/2011 | Zhang |
| 2011/0298564 | A1 | 12/2011 | Iwashita et al. |
| 2012/0205754 | A1 | 8/2012 | Iwamoto |
| 2013/0049545 | A1 | 2/2013 | Zou et al. |
| 2013/0057115 | A1 | 3/2013 | Saito et al. |
| 2013/0140959 | A1 | 6/2013 | Shin et al. |
| 2014/0125203 | A1 | 5/2014 | Choy et al. |
| 2014/0354109 | A1 | 12/2014 | Grannen et al. |
| 2016/0065171 | A1 | 3/2016 | Ruby et al. |
| 2016/0294354 | A1 | 10/2016 | Saijo et al. |
| 2016/0352309 | A1 | 12/2016 | Xu et al. |
| 2017/0077385 | A1 | 3/2017 | Stokes et al. |
| 2017/0149405 | A1* | 5/2017 | Kishimoto ............. H03H 9/173 |
| 2017/0338399 | A1 | 11/2017 | Kim et al. |
| 2018/0138885 | A1 | 5/2018 | Stokes et al. |
| 2019/0149129 | A1* | 5/2019 | Ueda ........................ H03H 3/10 333/186 |
| 2019/0356293 | A1 | 11/2019 | Kim et al. |
| 2020/0028482 | A1 | 1/2020 | Hou et al. |
| 2020/0220520 | A1 | 7/2020 | Stokes et al. |
| 2020/0235718 | A1 | 7/2020 | Modarres-Zadeh et al. |
| 2020/0313648 | A1 | 10/2020 | Wang et al. |
| 2021/0006220 | A1 | 1/2021 | Schiek et al. |
| 2021/0099156 | A1 | 4/2021 | Kirkendall et al. |
| 2021/0111693 | A1 | 4/2021 | Hou et al. |
| 2021/0111699 | A1 | 4/2021 | Hou et al. |
| 2021/0111701 | A1 | 4/2021 | Hou et al. |
| 2021/0111702 | A1 | 4/2021 | Wang et al. |
| 2021/0143792 | A1 | 5/2021 | Pollard |
| 2021/0250012 | A1 | 8/2021 | Hou et al. |
| 2022/0416149 | A1 | 12/2022 | Hou et al. |

OTHER PUBLICATIONS

Yoo et al., Spurious Resonances in Bulk Acoustic Wave Resonators, Department of Physics, The Catholic University of America, Washington, D.C., © 1982 IEEE, 1982 Ultrasonics Symposium, 4 pgs.

Working principles and Applications of SAW/FBAR Devices, Taiyo Yuden Navigator, Oct. 2017, 6 pgs.

Stokes, Notice of Allowance, U.S. Appl. No. 15/789,109, dated Nov. 14, 2019, 11pgs.

Wang, Office Action, U.S. Appl. No. 16/368,754, dated Jul. 13, 2022, 7pgs.

Global Communication Semiconductors, Inc., Restriction Election, U.S. Appl. No. 16/455,627, Aug. 19, 2022, 7 pgs.

Global Communication Semiconductors, Inc., CN Office Action, Chinese Application No. 201711127532.1, dated Nov. 22, 2022, 23 pgs.

Global Communication Semiconductors, Inc., U.S. Office Action, U.S. Appl. No. 16/820,625, dated Nov. 14, 2022, 10 pgs.

Global Communication Semiconductors, Inc., U.S. Notice of Allowance, U.S. Appl. No. 16/820,625, dated Apr. 5, 2023, 8 pgs.

Global Communication Semiconductors, Inc., U.S. Non-Final Office Action, U.S. Appl. No. 17/071,831, dated Jul. 17, 2023, 12 pgs.

Global Communication Semiconductors, Inc., Restriction Election, U.S. Appl. No. 17/071,810, Aug. 9, 2023, 7 pgs.

Global Communication Semiconductors, Inc., Restriction Election, U.S. Appl. No. 17/071,836, Jun. 21, 2023, 7 pgs.

Global Communication Semiconductors, Inc., U.S. Non-Final Office Action, U.S. Appl. No. 17/071,836, dated Aug. 1, 2023, 13 pgs.

* cited by examiner

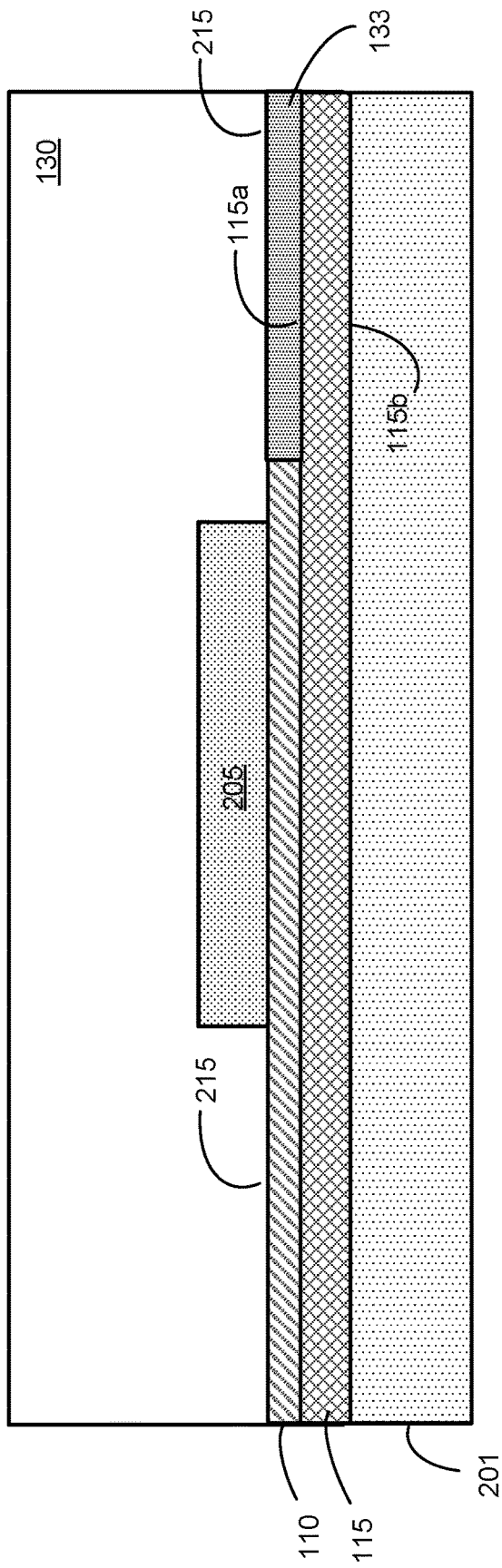
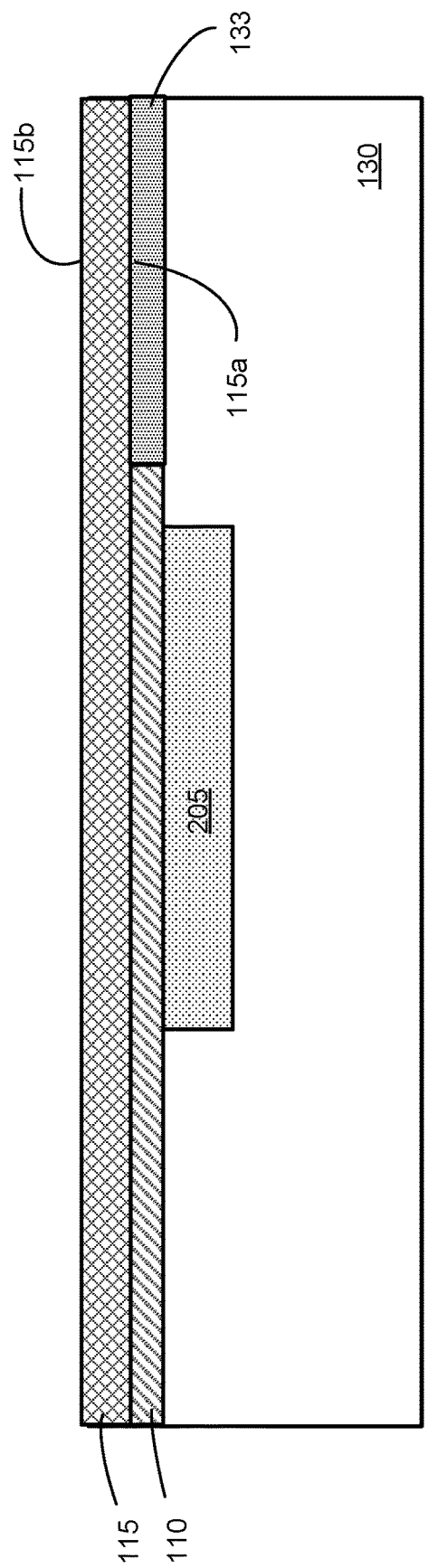
Figure 2D
Figure 2E

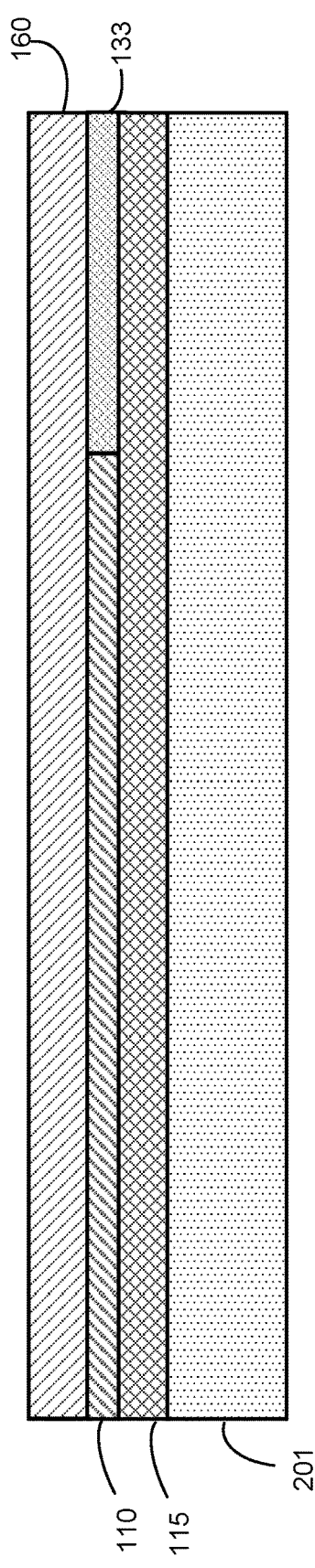
Figure 7A
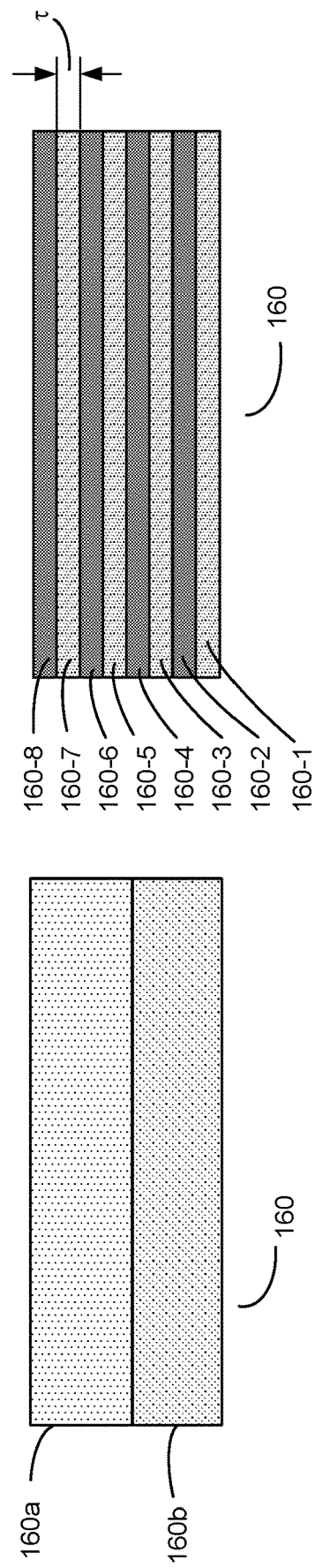
Figure 7C
Figure 7B

SINGLE-CRYSTAL BULK ACOUSTIC WAVE RESONATOR AND METHOD OF MAKING THEREOF

CROSS REFERENCE TO RELATED APPLICATIONS

The present application is a continuation-in-part of U.S. patent application Ser. No. 16/368,754, filed Mar. 28, 2019, entitled "Single-Crystal Bulk Acoustic Wave Resonator and Method of Making thereof," which is incorporated herein by reference in its entirety.

TECHNICAL FIELD

The disclosed embodiments relate generally to bulk acoustic wave resonators, and in particular, to single-crystal film bulk acoustic wave resonators and method of making thereof.

BACKGROUND

A bulk acoustic wave (BAW) resonator (or BAWR) typically includes a piezoelectric thin film layer between a bottom electrode and a top electrode. When an oscillating electrical signal is applied between the top and bottom electrodes, the piezoelectric thin film layer converts the oscillating electrical signal into bulk acoustic waves. The resonance frequency of the BAW resonator is mainly determined by the acoustic velocity and thickness of the piezoelectric layer and the electrodes. Piezoelectric thin film materials used for bulk acoustic wave devices include AlN, ZnO thin films for small bandwidth applications and ScAlN or PZT films for wide bandwidth applications. BAW resonators are widely used in RF filters in mobile devices due to their compact size and high performance.

The performance of BAW resonators is primarily determined by the acoustic property of the piezoelectric thin films, characterized by their electromechanical coupling coefficients ($K^2_{eff}$) and Q-factor. Piezoelectric thin films showing high electromechanical coupling coefficient (e.g., $K^2_{eff}$~10%) can be used for wide bandwidth filter applications. Currently, BAW resonators are normally constructed by depositing piezoelectric (e.g., AlN) thin films via physical vapor deposition (PVD) techniques such as sputter deposition. The resulting PVD AlN thin films are polycrystalline, which have significantly lower crystalline quality and thus lower electromechanical coupling coefficient and lower Q-factor/higher acoustic loss compared to single crystal AlN films. Furthermore, it has been reported (e.g., in S. R. Choi, "Thermal Conductivity of AlN and SiC Thin Films" Int. Jo. of Thermophysics, p 896, 2006) that thermal conductivity of polycrystalline AlN thin films degrades as film thickness decreases, resulting in compromised power handling capability of the associated BAW resonators.

SUMMARY

Accordingly, there is a need for a BAW resonator with an electromechanical coupling coefficient and Q-factor higher than what can be achieved by conventional fabrication methods. There is also a need for a method for fabricating such a BAW resonator that is cost-effective and applicable in a mass production environment.

In some embodiments, a bulk acoustic resonator includes a piezoelectric layer having a first side and a second side opposite to the first side, a first electrode layer formed on the first side of the piezoelectric layer, a support structure on the first side of the piezoelectric layer, and a second electrode layer formed on the second side of the piezoelectric layer. In some embodiments, the first electrode, the piezoelectric layer, and the second electrode together form a BAW stack or stack configured to resonate in response to an electrical signal applied between the first electrode and the second electrode. The support structure includes a cavity or an acoustic mirror adjacent the first electrode to reduce leakage of acoustic energy from the stack into the support structure.

In some embodiments, the piezoelectric layer includes one or more single crystalline or polycrystalline piezoelectric materials epitaxially grown or physically deposited from the second side to the first side on a surrogate substrate that is subsequently removed. In some embodiments, the piezoelectric layer includes a multilayer structure having two or more sublayers of two or more piezoelectric materials epitaxially grown and/or physically deposited on the surrogate substrate that is subsequently removed. In some embodiments, the multilayer structure includes a first sublayer of a first piezoelectric material at the second side and a second sublayer of a second piezoelectric material at the first side, the first sublayer being epitaxially grown or physically deposited on a surrogate substrate that has been removed, and the second sublayer being epitaxially grown or physically deposited over the first sublayer.

In some embodiments, the first electrode layer is deposited on the first side of the piezoelectric layer, and the second electrode layer is deposited on the second side of the piezoelectric layer. In some embodiments, the support structure includes a support substrate, the support substrate including one or more layers of one or more high resistivity materials. In some embodiments, the one or more high resistivity materials include one or more ceramic materials (e.g., aluminum oxide or alumina ($Al_2O_3$)). In some embodiments, the one or more high resistivity materials includes aluminum oxide or alumina ($Al_2O_3$), polysilicon, Benzocyclobutene (BCB), and/or glass.

In some embodiments, the support structure includes a frame layer surrounding the cavity, and a support substrate adjacent the frame layer and the cavity. The frame layer includes one or more layers of one or more high resistivity materials, such as aluminum oxide or alumina ($Al_2O_3$), polysilicon, and/or Benzocyclobutene (BCB). The support substrate includes one or more layers of one or more high resistivity materials, such as alumina (Al2O3), gallium arsenide (GaAs), silicon (Si), silicon carbide (SiC), sapphire, and/or glass. In some embodiments, the support substrate is attached to the frame layer by a glue material.

In some embodiments, the support structure includes a support substrate having a preformed cavity and attached to the first electrode layer. The support substrate includes high-resistivity aluminum oxide (Al2O3), silicon (Si), gallium arsenide (GaAs), silicon carbide (SiC), sapphire, and/or glass. In some embodiments, the support substrate has a cavity etched therein before the support substrate is attached to the first electrode layer.

In some embodiments, the support structure includes a cavity frame and a support substrate; the cavity frame includes first and second metal frames bonded together by metal-to-metal bonding; and the cavity is defined by the first electrode, the cavity frame and the support substrate. In some embodiments, the first metal frame is formed on the first electrode layer, and the second metal frame is formed on the support substrate and has a pattern at least partially matching that of the first metal frame.

In some embodiments, the support structure includes an acoustic mirror instead of a cavity, and a support substrate attached to the acoustic mirror using, for example, a glue layer. In some embodiments, the acoustic mirror includes a multilayer structure with alternating layers of one or more high acoustic impedance materials and one or more low acoustic impedance materials, each layer of the multilayer structure having a thickness of one quarter wavelength of a resonance frequency of the bulk acoustic resonator.

In some embodiments, the one or more high acoustic impedance materials are selected from the group consisting of tungsten (W), Gold (Au), Tantalum (Ta), Molybdenum (Mo), and Ruthenium (Ru), and the one or more low acoustic impedance material are selected from the group consisting of silicon dioxide (SiO2) and silicon nitride (SiN). In some embodiments, the acoustic mirror includes one or more layers of one or more of polyimide (PI), Benzocyclobutene (BCB), and polydimethylsiloxane (PDMS).

In some embodiments, a process of fabricating a bulk acoustic resonator comprises forming a piezoelectric layer on a surrogate substrate; forming a first electrode layer on a first side of the piezoelectric layer; forming a support structure over the first electrode layer; removing the surrogate substrate to expose a second side of the piezoelectric layer; and forming a second electrode layer on the second side of the piezoelectric layer. In some embodiments, the first electrode, the piezoelectric layer, and the second electrode together form a BAW stack or stack configured to resonate in response to an electrical signal applied between the first electrode and the second electrode. The support structure includes a cavity or acoustic mirror adjacent the first electrode layer to reduce leakage of acoustic energy from the stack to the support structure.

In some embodiments, forming a piezoelectric layer on a surrogate substrate comprises epitaxially growing or physically depositing one or more single crystalline or polycrystalline piezoelectric materials on the surrogate substrate. In some embodiments, the piezoelectric layer includes a multilayer structure of two or more piezoelectric materials, and wherein forming a piezoelectric layer on a surrogate substrate comprises epitaxially growing or physically depositing a first sublayer of a first piezoelectric material on the surrogate substrate, and epitaxially growing or physically depositing at least one second sublayer of at least one second piezoelectric material on the first sublayer of the first piezoelectric material. The first sublayer is at the second side of the piezoelectric layer and one of the at least one second sublayer is at the first side of the piezoelectric layer.

In some embodiments, forming a first electrode layer on a first side of the piezoelectric layer comprises depositing and then patterning a film of electrically conductive material on the first side of the piezoelectric film, and forming a second electrode layer on the second side of the piezoelectric layer comprises depositing and then patterning a film of electrically conductive material on the second side of the piezoelectric film after the surrogate substrate is removed.

In some embodiments, forming the support structure over the first electrode layer comprises forming a sacrificial layer over the first electrode layer, the sacrificial layer occupying a space of the cavity; and forming a support substrate around and over the sacrificial layer. The sacrificial layer is removed subsequently, leaving the cavity in the support structure.

In some embodiments, the support structure includes a support substrate formed using chemical vapor deposition (CVD), spin-on, taping and/or co-firing. In some embodiments, the support substrate includes one or more layers of one or more high resistivity materials. In some embodiments, the one or more high resistivity materials include a ceramic material. In some embodiments, the one or more high resistivity materials includes aluminum oxide (Al2O3), polysilicon, Benzocyclobutene (BCB), and/or glass.

In some embodiments, the support structure includes a frame layer and a support substrate, and forming the support structure over the first electrode layer comprises forming a frame layer around a space of the cavity; and attaching the support substrate to the frame layer (e.g., using a glue material) to form the support structure with the cavity. In some embodiments, the frame layer includes one or more layers of one or more high resistivity materials, such as aluminum oxide or alumina ($Al_2O_3$), polysilicon, and/or Benzocyclobutene (BCB), the support substrate includes one or more layers of one or more high resistivity materials, such as alumina (Al2O3), gallium arsenide (GaAs), silicon (Si), silicon carbide (SiC), sapphire, and glass.

In some embodiments, the frame layer includes a glue material, and the support substrate is attached to the frame layer using the glue material. In some embodiments, forming the frame layer comprises: forming a sacrificial layer over the first electrode layer, the sacrificial layer occupying the space of the cavity; and forming the frame layer surrounding the sacrificial layer. The sacrificial layer can be removed either before or after the support substrate is attached to the frame layer.

In some embodiments, forming the support structure over the first electrode layer comprises attaching a support substrate having a preformed cavity to the first electrode layer. In some embodiments, the support substrate having the preformed cavity includes a frame layer and a support substrate combined into one pre-formed substrate. In some embodiments, the support substrate having the preformed cavity includes a high resistivity substrate with an etched cavity. The high resistivity substrate with the cavity etched therein is subsequently attached to the surrogate substrate with the piezoelectric layer and the first electrode layer formed thereon. The support substrate can include one or more of silicon (Si), gallium arsenide (GaAs), sapphire, silicon carbide (SiC), ceramic, and glass.

In some embodiments, forming a support structure over the first electrode layer comprises: forming a first metal frame over the first electrode layer; forming a second metal frame over a fourth substrate, the second metal frame at least partially matching the first metal frame; and bonding the first metal frame with the second metal frame to form a cavity frame.

In some embodiments, forming the support structure over the first electrode layer comprises forming an acoustic mirror over the first electrode layer; and attaching a support substrate to the acoustic mirror using, for example, a glue layer. In some embodiments, the acoustic mirror functions to reflect bulk acoustic waves in the bulk acoustic resonator and prevent them from leaking out into the support substrate.

In some embodiments, the acoustic mirror includes a multilayer structure, the multilayer structure including alternating layers of a high acoustic impedance material and a low acoustic impedance material, with each of the alternating layers having a thickness of one quarter wavelength of the BAW resonator's designed resonance frequency. Examples of the high acoustic impedance material include tungsten (W), Gold (Au), Tantalum (Ta), Molybdenum (Mo), and Ruthenium (Ru). Examples of the low acoustic impedance material include silicon dioxide (SiO2) and silicon nitride (SiN).

In some embodiments, the acoustic mirror includes one of more layers of materials with very low acoustic impedance, such as polyimide (PI), Benzocyclobutene (BCB), and polydimethylsiloxane (PDMS), Thus, the process of fabricating a bulk acoustic resonator according to some embodiments allows the bulk acoustic resonator to have an epitaxially grown piezoelectric thin film layer. The process is cost-effective and applicable in a mass production environment because it does not require complicated backside processing. The BAW resonator thus formed is characterized by good confinement of the bulk acoustic wave energy, a high degree of crystallinity, and minimal dispersion loss of acoustic signals.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIGS. 2A-2K are cross-sectional diagrams illustrating a process of fabricating a bulk acoustic wave resonator, in accordance with some embodiments.

FIGS. 7A-7E are cross-sectional diagrams illustrating a process for forming a support structure including an acoustic mirror in a bulk acoustic wave resonator, in accordance with some embodiment.

Figure 1A:
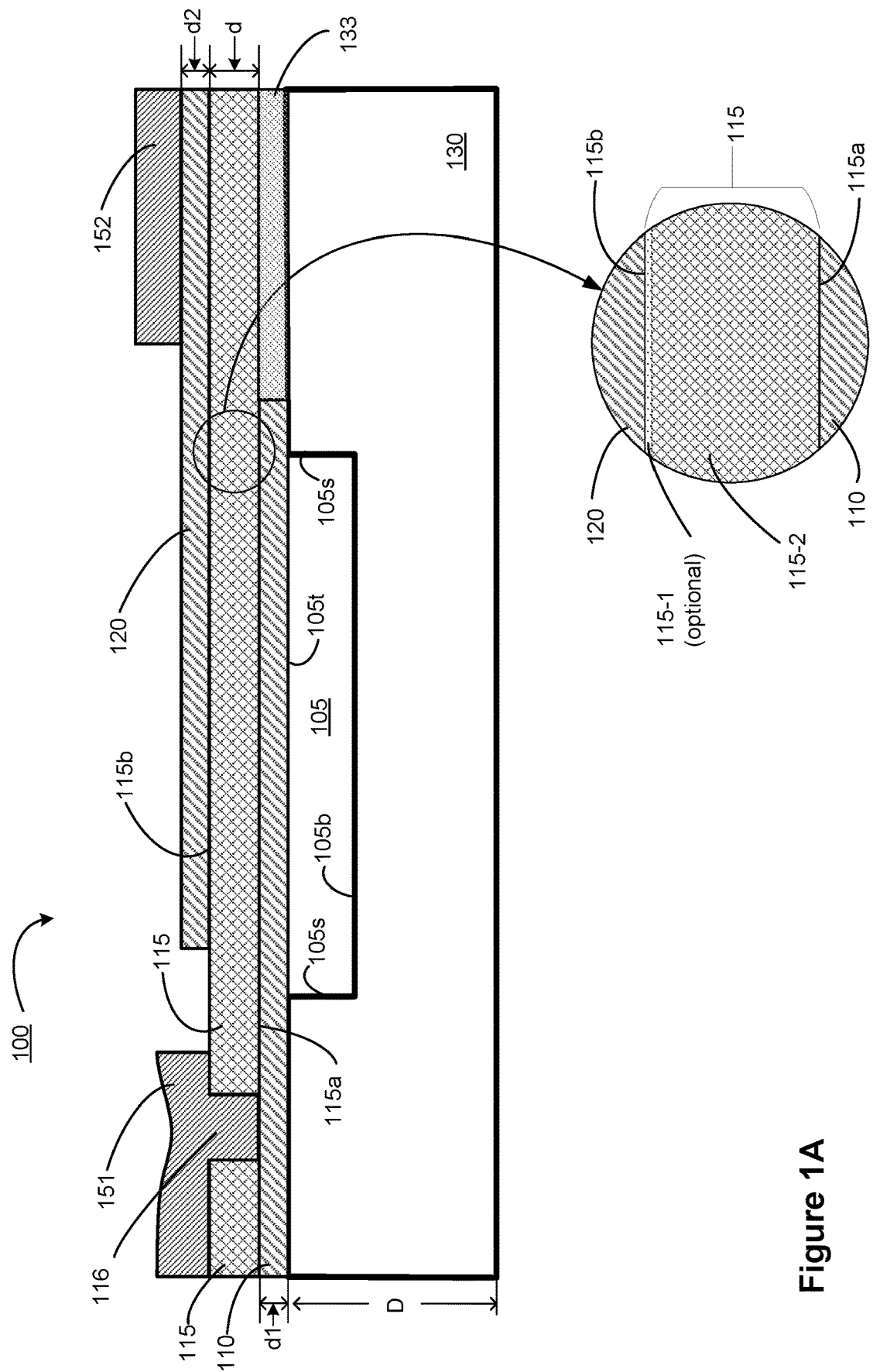
FIGS. 1A-1B are a cross-sectional diagrams of bulk acoustic wave resonators, in accordance with some embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include systems, methods and/or devices with structures for improved performance and manufacturability (A1) Some embodiments include a bulk acoustic resonator prepared by a process comprising the steps of: forming a piezoelectric layer on a surrogate substrate; forming a first electrode layer on a first side of the piezoelectric layer; forming a support structure over the first electrode layer; removing the surrogate substrate to expose a second side of the piezoelectric layer; and forming a second electrode layer on the second side of the piezoelectric layer; wherein the support structure includes a cavity or acoustic mirror adjacent the first electrode layer.

(A2) In some embodiments of the bulk acoustic resonator of A1, forming a piezoelectric layer on a surrogate substrate comprises epitaxially growing or physically depositing one or more single crystalline or polycrystalline piezoelectric materials on the surrogate substrate.

(A3) In some embodiments of the bulk acoustic resonator of A1 or A2, the piezoelectric layer includes a multilayer structure of one or more piezoelectric materials, and wherein forming a piezoelectric layer on a surrogate substrate comprises epitaxially growing or physically depositing a first sublayer of a first piezoelectric material on the surrogate substrate and epitaxially growing or physically depositing at least one second sublayer of at least one second piezoelectric material on the first sublayer of the first piezoelectric material.

(A4) In some embodiments of the bulk acoustic resonator of any of A1-A3, forming a first electrode layer on a first side of the piezoelectric layer comprises depositing and then patterning a film of electrically conductive material on the first side of the piezoelectric film, and wherein forming a second electrode layer on the second side of the piezoelectric layer comprises depositing and then patterning a film of electrically conductive material on the second side of the piezoelectric film after the surrogate substrate is removed.

(A5) In some embodiments of the bulk acoustic resonator of any of A1-A4, forming the support structure over the first electrode layer comprises: forming a sacrificial layer over the first electrode layer, the sacrificial layer occupying a space of the cavity; and forming a support substrate around and over the sacrificial layer; wherein the sacrificial layer is subsequently removed to leave the cavity in the support structure.

(A6) In some embodiments of the bulk acoustic resonator of A5, the support substrate is formed using one or more processes selected from the group consisting of: chemical vapor deposition (CVD), spin-on, taping and co-firing.

(A7) In some embodiments of the bulk acoustic resonator of any of A5 and A6, the support substrate includes one or more layers of one or more high resistivity materials selected from the group consisting of aluminum oxide (Al2O3), polysilicon, Benzocyclobutene (BCB), and glass.

(A8) In some embodiments of the bulk acoustic resonator of any of A1-A4, the support structure includes a frame layer and a support substrate, and wherein forming the support structure over the first electrode layer comprises: forming a frame layer surrounding a space of the cavity; and attaching the support substrate to the frame layer to form the support structure with the cavity.

(A9) In some embodiments of the bulk acoustic resonator of A8, the frame layer includes one or more layers of one or more high resistivity materials selected from the group consisting of: aluminum oxide or alumina (Al2O3), polysilicon, and/or Benzocyclobutene (BCB), and the support substrate includes one or more layers of one or more high resistivity materials selected from the group alumina (Al2O3), gallium arsenide (GaAs), silicon (Si), silicon carbide (SiC), sapphire, and glass.

(A10) In some embodiments of the bulk acoustic resonator of any of A8-A9, forming the frame layer comprises: forming a sacrificial layer over the first electrode layer, the sacrificial layer occupying a space of the cavity; and forming the frame layer surrounding the sacrificial layer.

(A11) In some embodiments of the bulk acoustic resonator of any of A1-A4, forming the support structure over the first electrode layer comprises attaching a support substrate having a preformed cavity to the first electrode layer, the support substrate including one or more of: silicon (Si), gallium arsenide (GaAs), sapphire, silicon carbide (SiC), ceramic, and glass.

(A12) In some embodiments of the bulk acoustic resonator of any of A1-A4, the support structure includes a cavity frame and a support substrate, and forming the support structure over the first electrode layer comprises: forming a first metal frame over the first electrode layer; forming a second metal frame over the support substrate, the second metal frame having a pattern at least partially matching that of the first metal frame; and bonding the first metal frame with the second metal frame to form the cavity frame.

(A13) In some embodiments of the bulk acoustic resonator of any of A1-A4, forming the support structure over the first electrode layer comprises: forming an acoustic mirror over the first electrode layer; and attaching a support substrate to the acoustic mirror.

(A14) In some embodiments of the bulk acoustic resonator of A13, forming an acoustic mirror over the first electrode layer comprises forming (1101) one or more layers of one or more low acoustic impedance materials, such as polyimide (PI), Benzocyclobutene (BCB), and polydimethylsiloxane (PDMS), over the first electrode layer using, for example, evaporation, sputtering, CVD, and/or spin-on.

(A15) In some embodiments of the bulk acoustic resonator of A13, forming an acoustic mirror over the first electrode layer comprises forming alternating layers of one or more high acoustic impedance materials, such as tungsten (W), Gold (Au), Tantalum (Ta), Molybdenum (Mo), and/or Ruthenium (Ru), and one or more low acoustic impedance materials, such as silicon dioxide (SiO2) and/or silicon nitride (SiN), using, for example, evaporation, sputtering, CVD, and/or spin-on, each layer of the multilayer structure having a thickness of one quarter wavelength of a resonance frequency of the bulk acoustic resonator.

(A16) Some embodiments include a bulk acoustic resonator comprising: a piezoelectric layer having a first side and a second side opposite to the first side, the piezoelectric layer including one or more sublayers of one or more piezoelectric materials epitaxially grown or physically deposited from the second side to the first side; a first electrode layer formed on the first side of the piezoelectric layer; a support structure on the first side of the piezoelectric layer, the support structure including a cavity or an acoustic mirror adjacent the first electrode; and a second electrode layer formed on the second side of the piezoelectric layer.

(A17) In some embodiments of the bulk acoustic resonator of A16, the piezoelectric layer includes one or more single crystalline or polycrystalline piezoelectric materials epitaxially grown or physically deposited from the second side to the first side on a surrogate substrate that has been removed.

(A18) In some embodiments of the bulk acoustic resonator of any of A16 and A17, the piezoelectric layer includes a multilayer structure of piezoelectric materials, the multilayer structure including a first sublayer of a first piezoelectric material at the second side and a second sublayer of a second piezoelectric material at the first side, the first sublayer being epitaxially grown or physically deposited on a surrogate substrate that has been removed, and the second sublayer being epitaxially grown or physically deposited over the first sublayer.

(A19) In some embodiments of the bulk acoustic resonator of any of A16-A18, the first electrode layer is deposited on the first side of the piezoelectric layer, and the second electrode layer is deposited on the second side of the piezoelectric layer.

(A20) In some embodiments of the bulk acoustic resonator of any of A16-A19, the support structure includes a support substrate, the support substrate including one or more layers of one or more high resistivity materials.

(A21) In some embodiments of the bulk acoustic resonator of A20, the one or more high resistivity materials include one or more ceramic materials.

(A22) In some embodiments of the bulk acoustic resonator of A20, the one or more high resistivity materials include one or more materials selected from the group consisting of aluminum oxide (Al2O3), polysilicon, Benzocyclobutene (BCB), and glass.

(A23) In some embodiments of the bulk acoustic resonator of A20, the support structure further includes a frame layer surrounding the cavity, and the support substrate is adjacent the frame layer and the cavity, the frame layer including one or more layers of one or more high resistivity materials selected from the group consisting of: aluminum oxide or alumina (Al$_2$O$_3$), polysilicon, and/or Benzocyclobutene (BCB), the support substrate including one or more layers of one or more high resistivity materials selected from the group consisting of alumina (Al2O3), gallium arsenide (GaAs), silicon (Si), silicon carbide (SiC), sapphire, and glass.

(A24) In some embodiments of the bulk acoustic resonator of A23, the support substrate is attached to the frame layer by a glue material.

(A25) In some embodiments of the bulk acoustic resonator of any of A16-A19, the support structure includes a support substrate attached to the first electrode layer, the support substrate including one or more materials selected from the group consisting of high-resistivity aluminum oxide (Al2O3), silicon (Si), gallium arsenide (GaAs), silicon carbide (SiC), sapphire, and glass, and wherein the support substrate has a cavity etched therein before the support substrate is attached to the first electrode layer.

(A26) In some embodiments of the bulk acoustic resonator of any of A16-A19, the support structure includes a cavity frame and a support substrate, the cavity frame including: a first metal frame formed on the first electrode layer; and a second metal frame formed on the support substrate and bonded with the first metal frame via metal-to-metal bonding, the second metal frame having a pattern at least partially matching that of the first metal frame.

(A27) In some embodiments of the bulk acoustic resonator of any of A16-A19, the support structure include the acoustic mirror and a support substrate attached thereto, and wherein the acoustic mirror includes one or more layers of low acoustic impedance materials such as PI, BCB, and PDMS, or alternating layers of one or more high acoustic impedance materials and one or more low acoustic impedance materials, each layer of the alternating layers having a thickness of one quarter wavelength of a resonance frequency of the bulk acoustic resonator.

(A28) In some embodiments of the bulk acoustic resonator of A27, wherein the one or more high acoustic impedance materials are selected from the group consisting of tungsten (W), Gold (Au), Tantalum (Ta), Molybdenum (Mo), and Ruthenium (Ru), and wherein the one or more low acoustic impedance material are selected from the group consisting of silicon dioxide (SiO2) and silicon nitride (SiN).

(A29) In some embodiments of the bulk acoustic resonator of A27, the acoustic mirror includes one or more layers of one or more of polyimide (PI), Benzocyclobutene (BCB), and polydimethylsiloxane (PDMS).

(A30) In some embodiments of the bulk acoustic resonator of any of A12 and A26, the cavity frame is physically in contact with the support substrate on one side and with the first electrode on the other side, distal the first side.

(A31) In some embodiments of the bulk acoustic resonator of any of A12 and A30, the first metal frame, the first electrode, and the piezoelectric layer are transferred onto the support substrate from the surrogate substrate that is subsequently removed.

(A32) In some embodiments of the bulk acoustic resonator of any of A12, A26, and A30-A31, the first metal frame and the second metal frame are each a single layer, or multiple layers, or alloyed, as long as they can be bonded together.

(A33) In some embodiments of the bulk acoustic resonator of any of A12, A26, and A30-A32, the sizes (e.g., widths) of the first frame and the second metal frame are different to tolerate misalignment.

(A34) In some embodiments, the bulk acoustic resonator of any of A12, A26, and A30-A33 further comprises a filler outside the cavity and surrounding the cavity frame, the filler including a first filler layer and a second filler layer. The first filler layer is over the second filler layer and at least partially aligned with the second filler layer. The second filler layer is formed on the support substrate, and the first filler layer is formed on a surrogate substrate and transferred from the surrogate substrate.

(A35) In some embodiments of the bulk acoustic resonator of any of A12, A26, and A30-A34, the first metal frame is bonded with the second metal frame by metal-to-metal bonding.

(A36) In some embodiments of the bulk acoustic resonator of any of A12, A26, and A29-A34, the first metal frame is formed over the first electrode layer using physical deposition, or electroplating, and the second metal frame is formed over the support substrate using physical deposition, or electroplating.

(A37) In some embodiments of the bulk acoustic resonator of any of A12, A26, and A30-A36, the cavity frame includes gold (Au), or a gold-alloy, such as gold-tin (AuSn), or gold-indium (AuIn).

(A38) In some embodiments of the bulk acoustic resonator of any of A1-A37, each of the first electrode layer and the second electrode layer includes Molybdenum (Mo), Tungsten (W) or Ruthenium (Ru).

(A39) In some embodiments of the bulk acoustic resonator of any of A1-A38, the piezoelectric layer include one or more sublayers of one or more materials, such as single crystal or polycrystal aluminum nitride (AlN), scandium aluminum nitride (ScAlN), Zinc Oxide (ZnO), and/or lead zirconate titanate (PZT).

(A40) In some embodiments of the bulk acoustic resonator of A39, the piezoelectric layer further includes an amorphous or polycrystalline starter layer or buffer layer on the second side.

(A41) In some embodiments of the bulk acoustic resonator of any of A1-A15, removing the surrogate substrate comprises polishing or grinding a back side of the surrogate substrate to remove a main portion of the surrogate substrate and removing a remaining portion of the surrogate substrate using a selective etching process to expose the second side of the layer of piezoelectric material.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

FIG. 1A is a cross-sectional diagram of a bulk acoustic resonator 100, in accordance with some embodiments. As shown, the bulk acoustic resonator 100 includes a first electrode layer 110, a piezoelectric layer 115, and a second electrode layer 120. As shown, the piezoelectric layer 115 has a first side 115a and a second side 115b opposite to the first side 115a. The first electrode layer 110 is formed on the first side 115a of the piezoelectric layer 115, and the second electrode layer 120 is formed on the second side 115b of the piezoelectric layer 115. The bulk acoustic resonator 100 further includes a support structure 130 on the first side 115a of the piezoelectric layer 115. The support structure 130 includes a cavity 105 adjacent the first electrode layer 110 (e.g., the support structure 130 defines sidewalls 105s and a bottom 105b of the cavity 105 while the first electrode layer 110 borders a top 105t of the cavity 105).

In some embodiments, as shown in the insert in FIG. 1A, the piezoelectric layer 115 includes one or more single-crystalline and/or poly-crystalline piezoelectric materials 115-1 epitaxially grown and/or physically deposited from the second side 115b to the first side 115a on a surrogate substrate (not shown) that is subsequently removed. The surrogate substrate can be, for example, a silicon (Si), sapphire, or silicon carbide (SiC) substrate. The piezoelectric layer 115 can be grown using one or more well-known epitaxy processes, such as metalorganic chemical vapor deposition (MOCVD), molecular beam epitaxy (MBE), atomic layer epitaxy (ALE), techniques, at temperatures between approximately 500-1000° C. In some embodiments, depending on the epitaxy process used to form the piezoelectric layer 115, the piezoelectric layer 115 may further include a thin starting layer or buffer layer 115-1 formed at the second side 115b at the beginning of the epitaxy process. Afterwards, one or more single-crystalline piezoelectric materials 115-2 is grown over the starting layer or buffer layer 115-1. The starting layer or buffer layer 115-1 may be amorphous or polycrystalline. In some embodiments, the starting layer or buffer layer 115-1 is 1 nanometer to 30 nanometers in thickness. In some embodiments, the piezoelectric layer 115 does not include the starting layer or buffer layer 115-2. The one or more layers of single-crystalline piezoelectric materials 115-1 can be epitaxially grown from the second side 115b to the first side 115a on a surrogate substrate without the starting layer or buffer layer 115-2. In some embodiments, the starting layer or buffer layer 115-2 is removed during the process of removing the surrogate substrate.

Figure 1B:
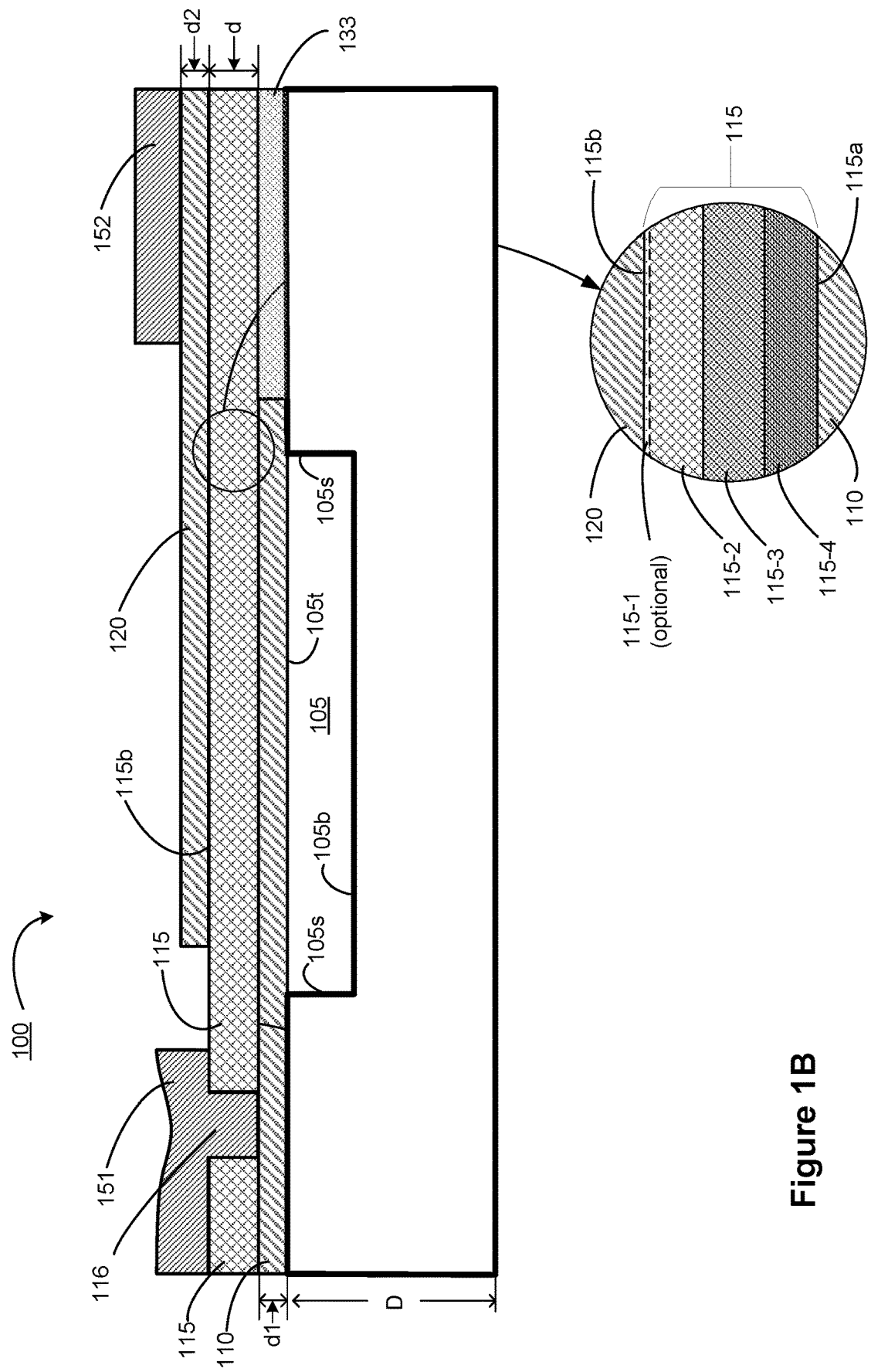

In some embodiments, as shown in FIG. 1B, the piezoelectric layer includes a multilayer structure of multiple sublayers of piezoelectric materials (e.g., sublayers 115-2, 115-3, 115-4) for improved BAW resonator performance. Each of the multiple sublayers of piezoelectric materials can be single-crystalline or poly-crystalline. The sublayers in the multilayer structure is epitaxially grown or physically deposited sequentially from the second side to the first side (e.g., sublayer 115-2 is grown over buffer sublayer 115-1 or directly on the surrogate substrate, sublayer 115-3 is grown over sublayer 115-2, and sublayer 115-4 is grown over sublayer 115-3). Thus, the multilayer structure includes at least a first sublayer 115-2 of a first piezoelectric material at the second side 115b and a second sublayer 115-4 of a second piezoelectric material at the first side 115a. The second piezoelectric material can be different form the first piezoelectric material. The first sublayer is epitaxially grown or physically deposited on a surrogate substrate that has been removed, and the second sublayer 115-4 is epitaxially grown or physically deposited over the first sublayer 115-2.

In some embodiments, the first electrode 110, the piezoelectric layer 115, and the second electrode 120 form a BAW stack configured to resonate in response to an electrical signal applied between the first electrode 110 and the second electrode 120. The cavity 105 provides a space adjacent the first electrode 110 in which the BAW stack is free to resonate in response to electrical signals provided between the first electrode 110 and the second electrode 120 so as to reduce acoustic energy leakage into the support structure 130. In some embodiments, the bulk acoustic resonator 100 includes a first contact 151 formed at least partially within a contact hole 116 in the piezoelectric layer 115, and a second contact 152 at least partially in contact with the second electrode 120. The first contact 151 and the second contact 152 provide electrical contacts with the first electrode 110 and the second electrode 120, respectively, to allow an electrical signal to be applied between the first electrode 110 and the second electrode 120. In some embodiments, the first electrode 110 is physically in contact with the first side 115a of the piezoelectric layer 115, and the second electrode 120 is physically in contact with the second side 115b of the piezoelectric layer 115. In some embodiments, a filler layer 133 is used to provide a planar surface over which the support structure 130 is formed, as discussed further below. Thus the support structure is partially in contact with the planarizing filler layer 133 and partially in contact with the first electrode 110.

Figure 1C:
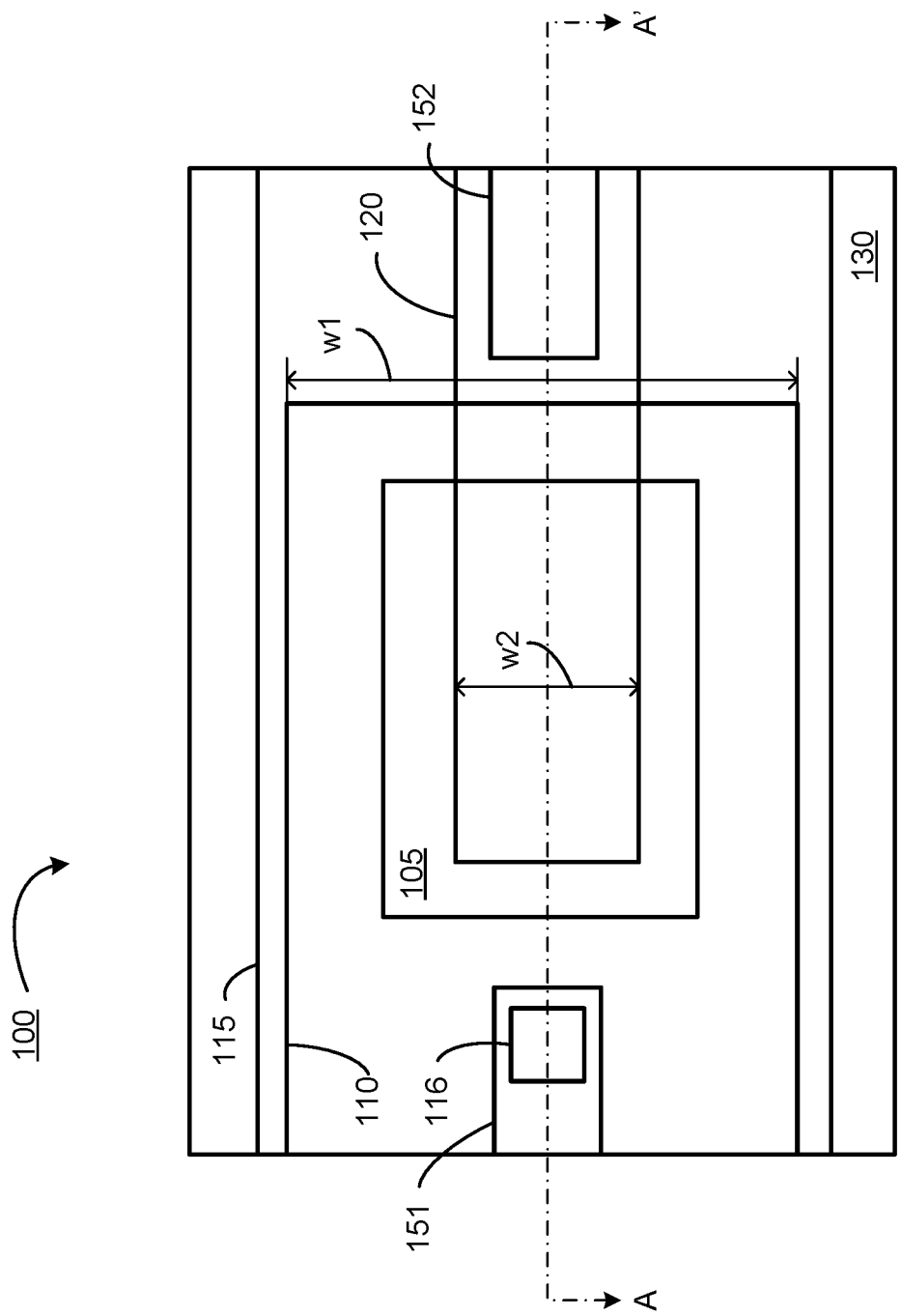
FIG. 1C is a top-down view of a bulk acoustic wave resonator, in accordance with some embodiments.

FIG. 1C is a top-down view of bulk acoustic resonator 100 illustrating lateral arrangement of various layers, including the support structure 130 with the cavity 105, the first electrode 110 adjacent the cavity 105, the piezoelectric layer 115 over the first electrode 110, the second electrode 120 over the piezoelectric layer 115, the contact hole 116, the first contact 151, and the second contact 152, according to some embodiments. FIG. 1A is a cross-sectional view along line A-A' shown in FIG. 1C.

In some embodiments, as shown in FIG. 1A or 1B, the piezoelectric layer 115 has a thickness d of about 100 nanometers to 5 micrometers. The first electrode 110 has a thickness d1 of about 20 nanometers to about 2 micrometers, and the second electrode 120 has a thickness d2 of about 20 nanometers to about 2 micrometers. The supporting structure 130 has a thickness D of about 50 micrometers to about 1000 micrometers In some embodiments, as shown in FIG. 1C, the first electrode 110 has a width w1 of about 20-500 micrometers, and the second electrode 120 has a width w2 of about 20-500 micrometers. In some embodiments, the support structure 130 includes silicon, glass, ceramic, gallium arsenide and/or silicon carbide, the first electrode 110 and the second electrode 120 each includes Molybdenum (Mo), Tungsten (W), and/or Ruthenium (Ru), and the piezoelectric layer includes one or more epitaxially grown and/or physically deposited layers of one or more piezoelectric materials, such as aluminum nitride (AlN), scandium aluminum nitride (SLAIN), Zinc Oxide (ZnO), lead zirconate titanate (PZT), etc.

Figure 1D:
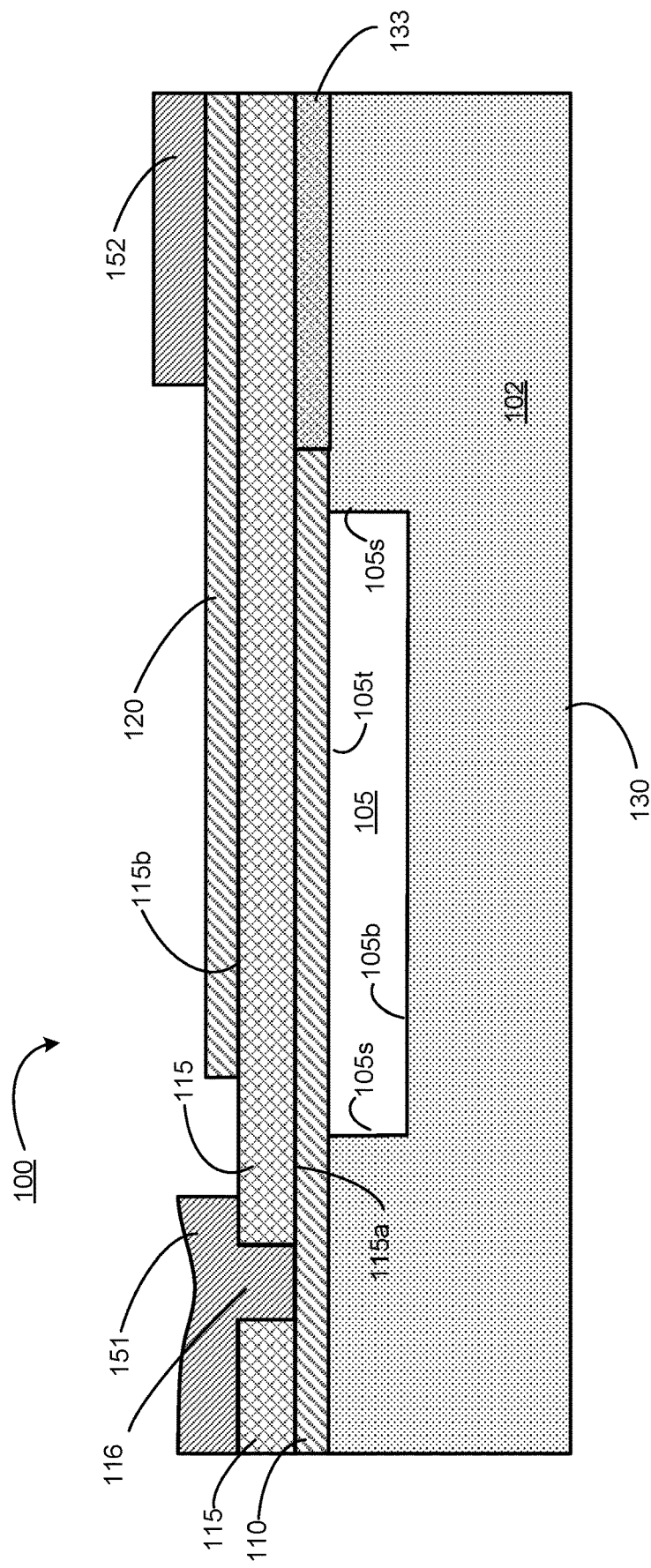
FIGS. 1D-1G are cross-sectional diagrams of bulk acoustic wave resonators, in accordance with some embodiments.

FIG. 1D is a cross-sectional diagram of the bulk acoustic wave (BAW) resonator 100, in accordance with some embodiments. FIG. 1D is similar to FIG. 1A or 1B except that FIG. 1D shows the support structure 130 as including a substrate 102 having a cavity 105 (e.g., the substrate 102 borders sidewalls 105s and a bottom 105b of the cavity 105). In some embodiments, the substrate 102 includes one or more layers of one or more high resistivity materials formed on the first electrode layer. In some embodiments, the one or more high resistivity materials includes one or more ceramic materials. In some embodiments, the one or more ceramic materials include aluminum oxide or alumina (Al2O3). In some embodiments, the one or more high resistivity materials include, for example, aluminum oxide or alumina (Al2O3), polysilicon, Benzocyclobutene (BCB), and/or glass. In some embodiments, the filler layer 133 similarly includes one or more layers of one or more high resistivity materials, such as one or more ceramic materials, or any of the high resistivity materials listed above.

In some embodiments, the substrate 102 is a substrate of high resistivity material(s) with the cavity 105 etched into it before it is attached to the first electrode layer 110. The substrate 102 with the preformed cavity 105 can be attached to the first electrode layer and the filler layer 133 using, for example, a glue material. The high resistivity material(s) can be, for example Si, GaAs, SiC, ceramic, sapphire, and/or glass.

Figure 1E:
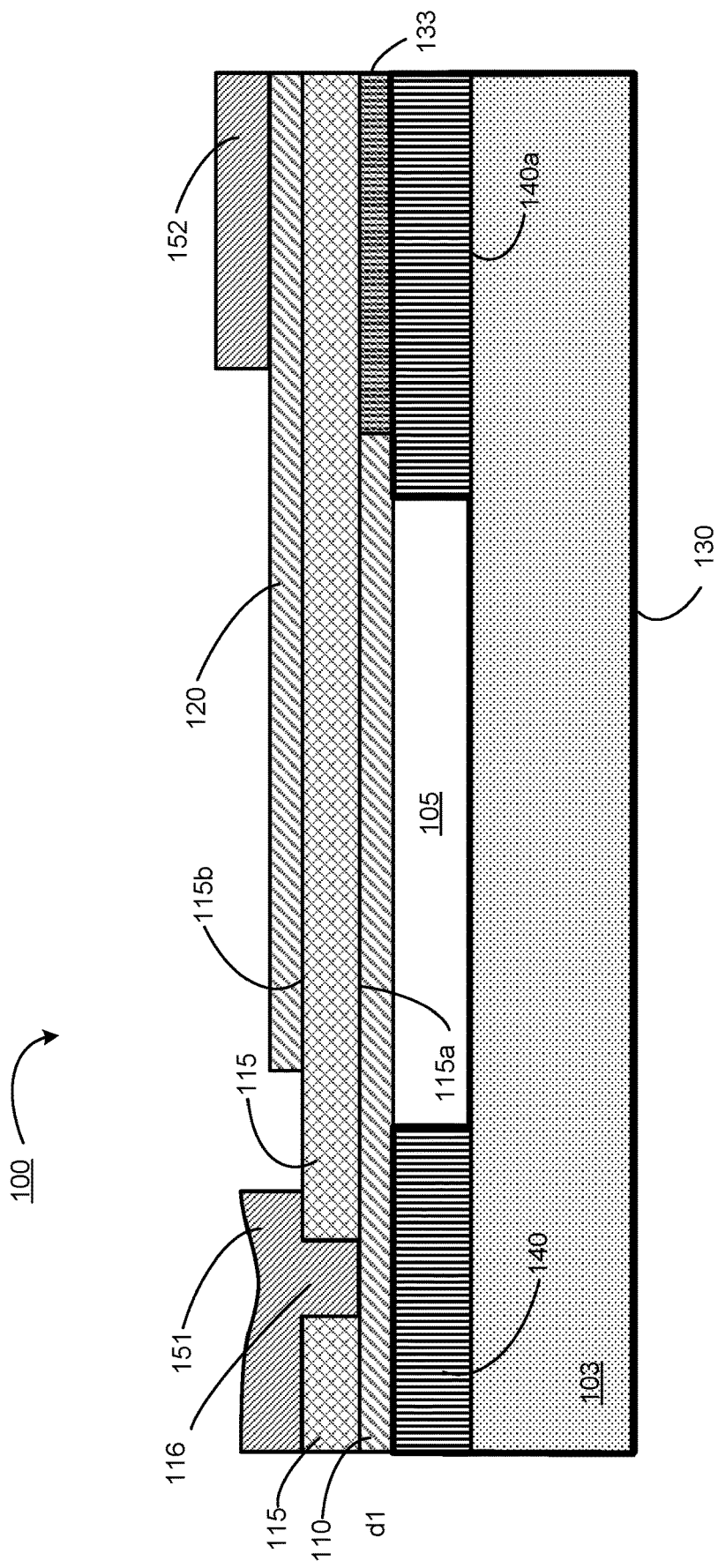

FIG. 1E is a cross-sectional diagram of the bulk acoustic wave (BAW) resonator 100, in accordance with some embodiments. FIG. 1E is similar to FIG. 1A or 1B except that FIG. 1E shows the support structure 130 as including a frame layer 140 surrounding the cavity and a support substrate 103 adjacent the frame layer and the cavity. In some embodiments, the substrate 103 includes one or more high resistivity substrate, such as silicon (Si), gallium arsenide (GaAs), silicon carbide (SiC), ceramic, sapphire, and/or glass substrate. In some embodiments, the support structure further includes a glue material 140a between the frame layer 140 and the substrate 103, and the substrate 103 is attached to the frame layer 140 by at least the glue material 140a. In some embodiments, the support structure 130 is further attached to the filler layer 133 around the first electrode 110.

Figure 1F:
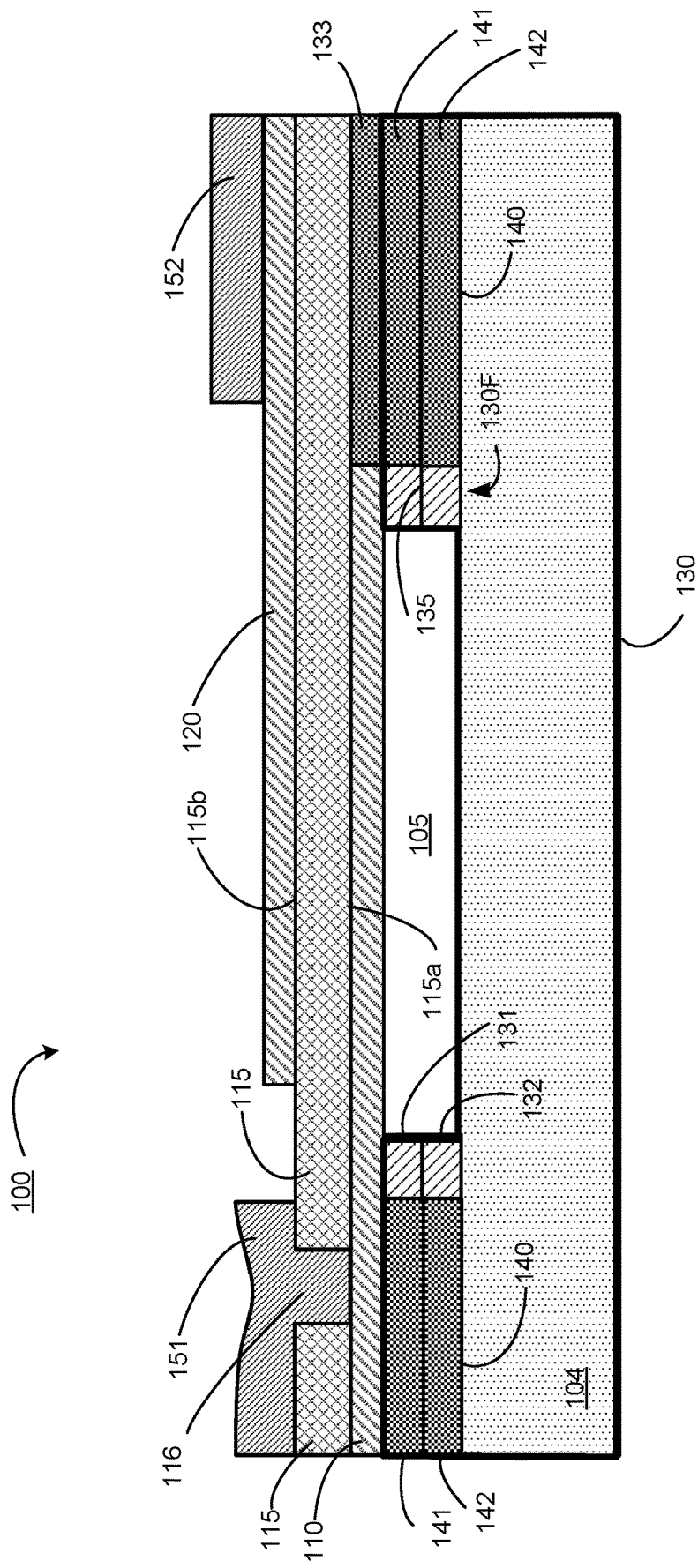

FIG. 1F is a cross-sectional diagram of the bulk acoustic wave (BAW) resonator 100, in accordance with some embodiments. FIG. 1F is similar to FIG. 1A or 1B except that FIG. 1F shows the support structure 130 as including a cavity frame 130F surrounding the cavity 105, a filler frame 140, and a substrate 104. In some embodiments, the cavity frame 130 includes a first metal frame 131 and a second metal frame 132 bonded together by metal-to-metal bonding 135. The first metal frame 131 and the second metal frame 132 each can be a single layer, or multiple layers, of one or more metals or metal alloys. In some embodiments, the first metal frame 131 and the second metal frame 132 have respective patterns that match each other although the respective patterns can be slightly different to tolerate misalignment. For example, metal layer 132 can have a wider dimension in at least one direction than metal layer 131, or vice versa, to allow misalignment during a bonding process.

In some embodiments, the filler frame 140 is outside the cavity frame 130F and surrounding the cavity frame 130F. The filler frame 140 includes a first filler layer 141 and a second filler layer 142 under and at least partially aligned with the first filler layer 141. In some embodiments, the first filler layer 141 is physically in contact with part of the piezoelectric layer 115 and with the first electrode 110, and the second filler layer 142 is physically in contact with the substrate 104. In some embodiments, the cavity frame 130 is physically in contact with the substrate 104 on one side and with the first electrode 110 on the other side, distal the one side. In some implementations, the cavity frame 130 includes metal or metal alloy, such as gold (Au), gold-tin (AuSn), or gold-indium (AuIn).

Figure 1G:
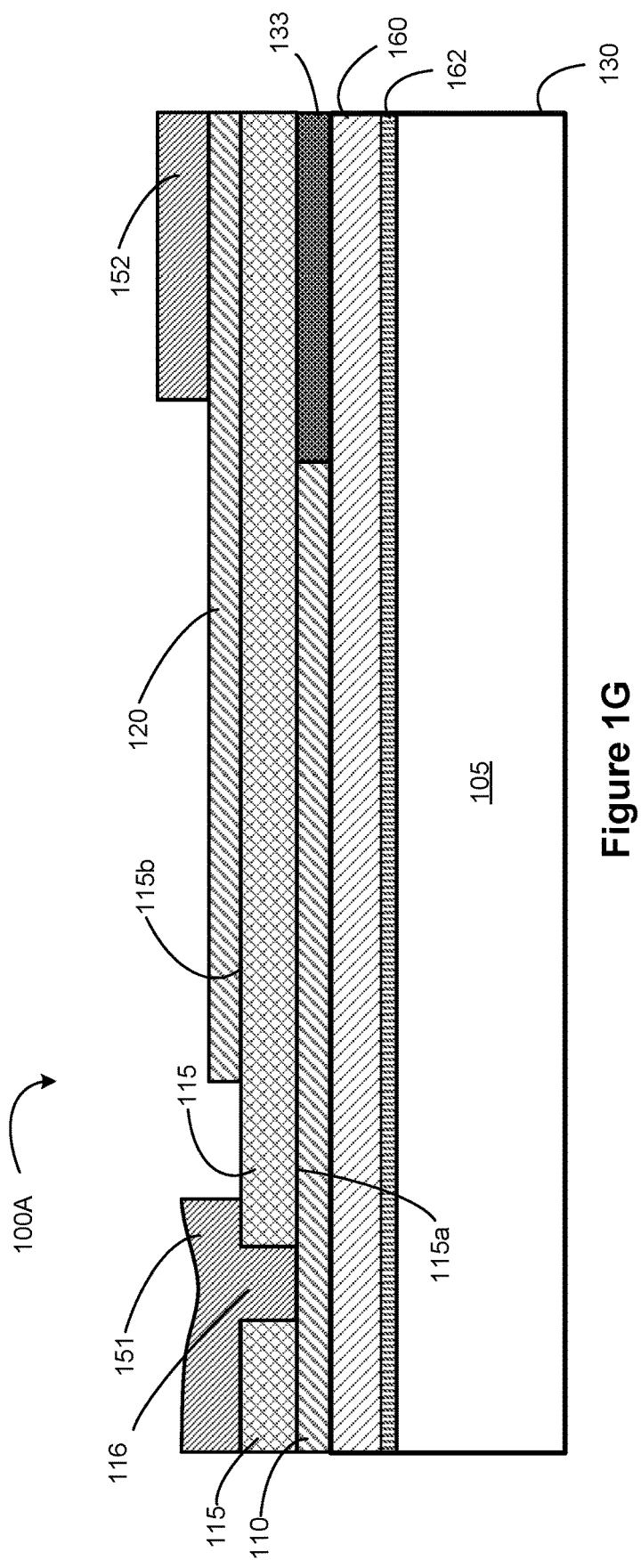
Figure 1I:
FIG. 1I is a cross-sectional diagram of an acoustic mirror including alternating layers of one or more high acoustic impedance materials and one or more low acoustic impedance materials.
Figure 1H:
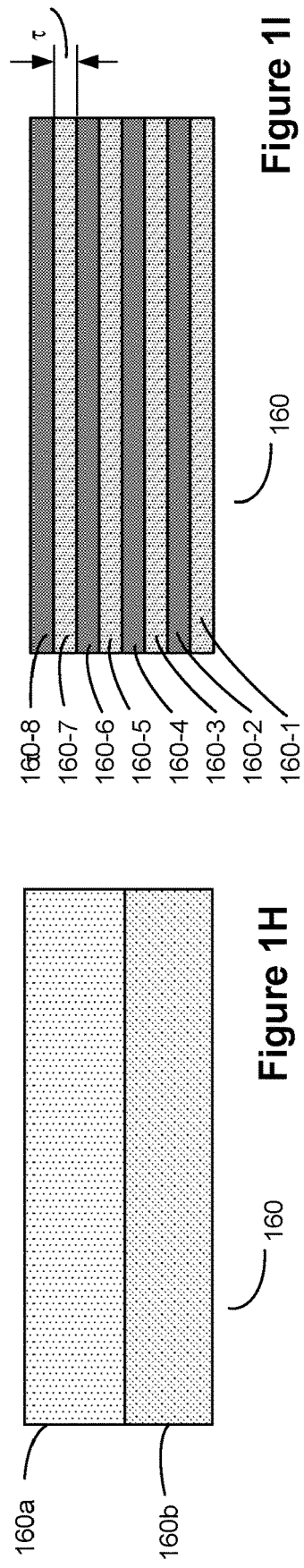
FIG. 1H is a cross-sectional diagram of an acoustic mirror including one or more layers of one or more low acoustic impedance materials.

FIG. 1G is a cross-sectional diagram of the bulk acoustic wave (BAW) resonator 100A, in accordance with some embodiments. BAW resonator 100A shown in FIG. 1G is similar to BAW resonator 100 shown in FIG. 1A or 1B except that the support structure 130 in BAW resonator 100A includes an acoustic mirror 160 instead of a cavity. In some embodiments, the support structure 130 further includes a support substrate 105. In some embodiments, the support substrate 105 is attached to the acoustic mirror 160 using, for example, a glue layer 162. In some embodiments, as shown in FIG. 1H, the acoustic mirror 160 includes one or more layers (e.g., layer(s) 160a and/or 160b) of one or more low acoustic impedance (low-Z) materials such as polyimide (PI), Benzocyclobutene (BCB), and polydimethylsiloxane (PDMS).

In some embodiments, the acoustic mirror includes alternating layers of one or more high acoustic impedance materials and one or more low acoustic impedance materials. For example, as shown in FIG. 1I, the alternating layers may include layers 160-1, 160-3, 160-5, and 160-7 of one or more high acoustic impedance materials and layers 160-2, 160-4, 160-6, and 160-8 of one or more low acoustic impedance materials. These layers are alternatingly formed in the order of 160-1, 160-2, 160-3, 160-4, 160-5, 160-6, 160-7 and 160-8, such that layer 160-1 is formed on the first electrode layer 110, layer 160-2 is formed on layer 160-1, layer 160-3 is formed on layer 160-2, and so forth. As a result, each of the layers 160-1, 160-3, 160-5, and 160-7 of one or more high acoustic impedance materials is adjacent to one or more of the layers 160-2, 160-4, 160-6, and 160-8 of one or more low acoustic impedance materials but not to any of the layers 160-1, 160-3, 160-5, and 160-7 of one or more high acoustic impedance materials.

In some embodiments, as shown in FIG. 1I, each layer of the alternating layers has a thickness τ equal to about one quarter wavelength of a resonance frequency of the bulk acoustic resonator 100A. In practice, the alternating layers can include more or less layers than those shown in FIG. 1I. In some embodiments, the one or more high acoustic impedance materials can include tungsten (W), Gold (Au), Tantalum (Ta), Molybdenum (Mo), and/or Ruthenium (Ru), and the one or more low acoustic impedance materials can include silicon dioxide (SiO2) and/or silicon nitride (SiN).

FIGS. 2A-2K and FIGS. 8A-8D illustrate a process 800 for fabricating the bulk acoustic resonator 100, in accordance with some embodiments. FIGS. 2A-2K illustrate cross-sectional views of bulk acoustic resonator 100 at various stages of process 800, in accordance with some embodiments. FIGS. 8A-8D are flowchart representation of process 800, in accordance with some embodiments.

As shown in FIG. 2A and FIGS. 8A-8C, at step 810 of process 800, a layer of one or more piezoelectric materials 115 (e.g., aluminum nitride, scandium-aluminum nitride, and/or zinc oxide) is epitaxially grown and/or physically deposited on a surrogate substrate 201 (e.g., single crystal silicon, sapphire, gallium arsenide and/or silicon carbide). For example, a crystalline (e.g., single crystal) AlN piezoelectric layer 115 can be epitaxially grown on a single crystal silicon (Si) (111) or Si (100) substrate using, for example, chemical vapor deposition, plasma-assisted molecular beam epitaxy, pulsed laser deposition, metalorganic chemical vapor deposition (MOCVD), molecular beam epitaxy (MBE), atomic layer epitaxy (ALE), etc., followed by annealing. The layer of one or more piezoelectric materials 115 has a first side 115a and a second side 115b (see FIG. 2B) opposite the first side. The second side 115b of the layers of piezoelectric materials 115 faces the first (surrogate) substrate 201. Thus the layer of one or more piezoelectric materials 115 is epitaxially grown and/or physically deposited from the second side 115b to the first side 115a.

Figure 8A:
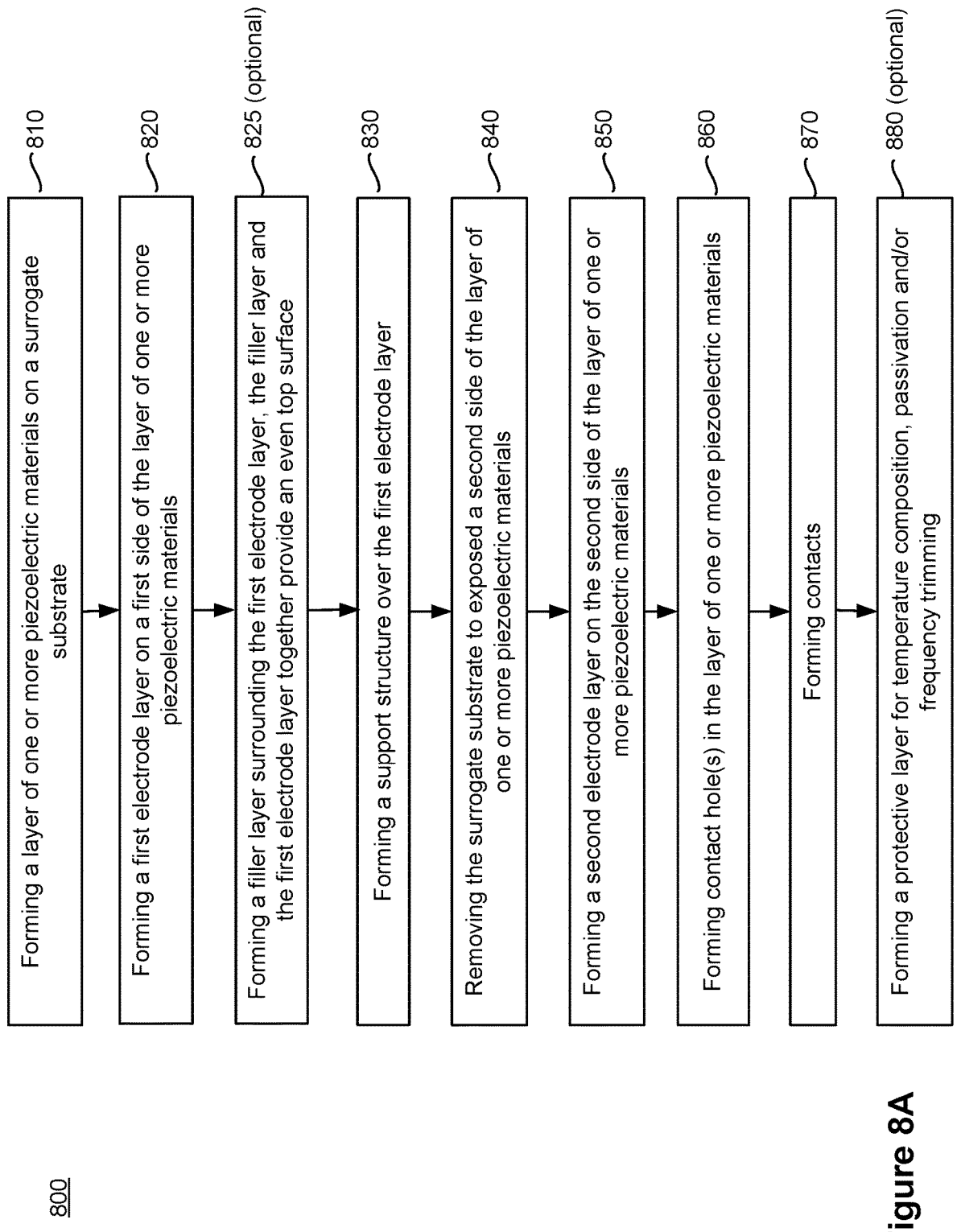
FIGS. 8A-8D and 9A-9C are flowchart representations of processes for fabricating a bulk acoustic wave resonator, in accordance with some embodiment.
Figure 8B:
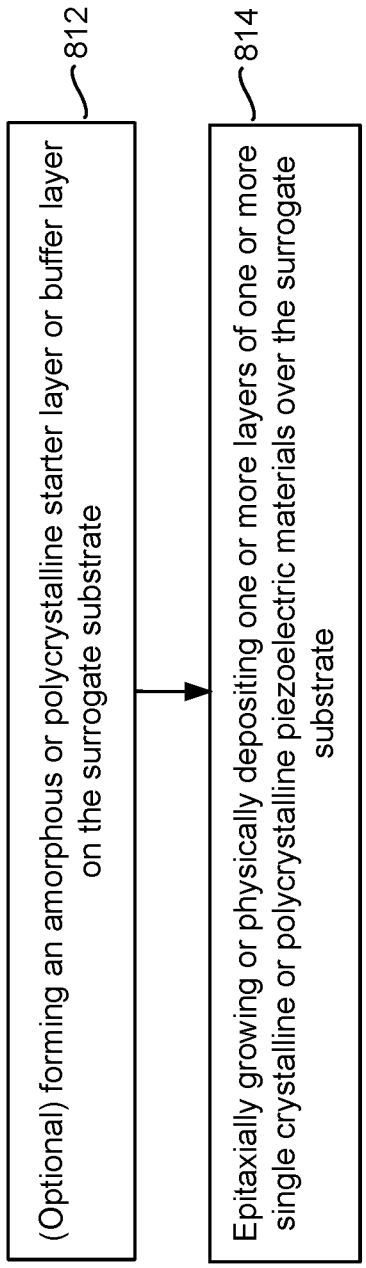

In some embodiments, as shown in FIG. 8B, forming the layer of one or more piezoelectric materials 115 includes an optional step of forming (812) a starter layer or buffer layer (not shown) on the surrogate substrate 201 and epitaxially growing or physically depositing (814) one or more layers of one or more single crystalline or polycrystalline piezoelectric materials over the surrogate substrate on the starter layer. Thus, a starter layer or buffer layer may be present at the second side 115b of the layer of piezoelectric material 115. In some embodiments, the starter layer or buffer layer may be amorphous or polycrystalline, while the rest of the layer of one or more piezoelectric materials 115 may include one or more single crystalline and/or polycrystalline piezoelectric materials. In some embodiments, the one or more layers of one or more single crystalline or polycrystalline piezoelectric materials epitaxially grown or physically deposited (814) over the surrogate substrate without the starter layer.

Figure 8C:
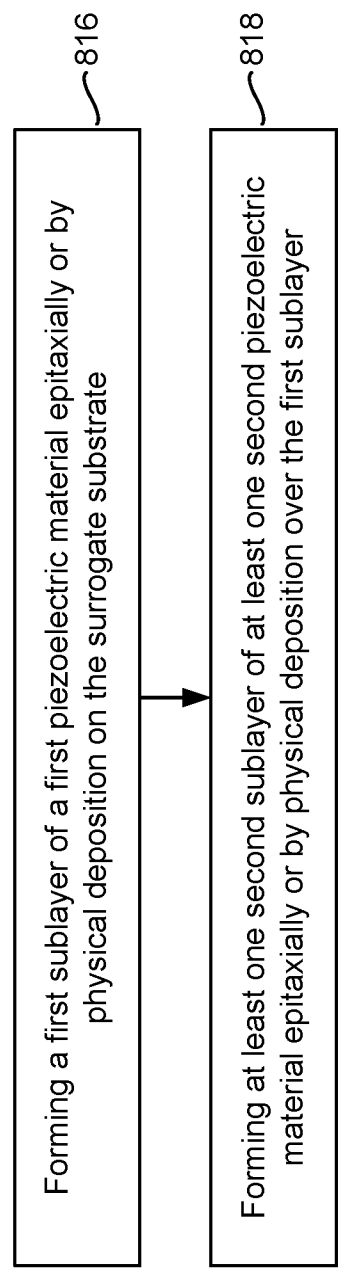

In some embodiments, as shown in FIG. 8C, forming the layer of one or more piezoelectric materials 115 includes forming (816) a first sublayer of a first piezoelectric material epitaxially or by physical deposition on the surrogate substrate 201, and forming (818) at least one second sublayer of at least one second piezoelectric material epitaxially or by physical deposition over the first sublayer. Thus, in some embodiments, the layer of one or more piezoelectric materials 115 includes a multilayer structure having multiple sublayers of piezoelectric materials epitaxially grown and/or physically deposited sequentially from the second side 115b to the first side 115a.

Figure 2A:
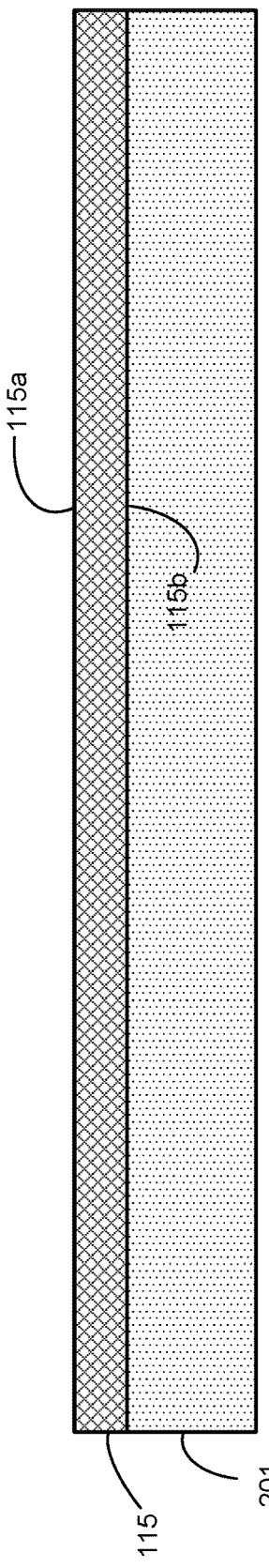
Figure 2B:
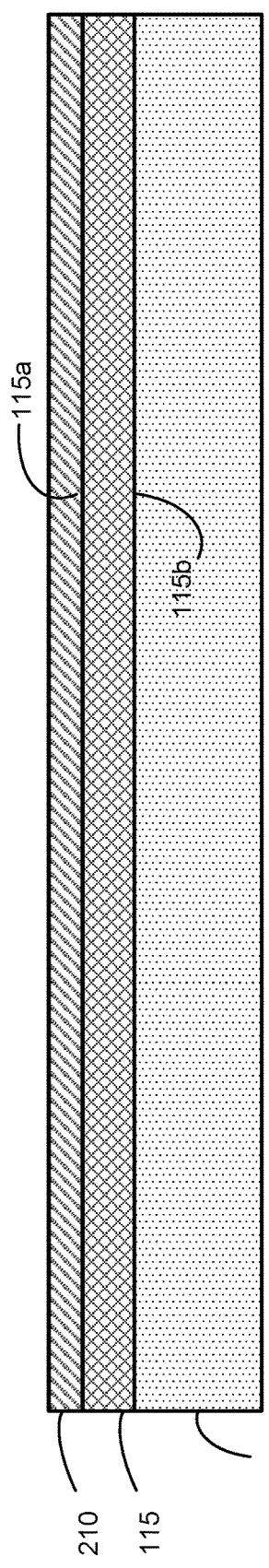
Figure 2C:
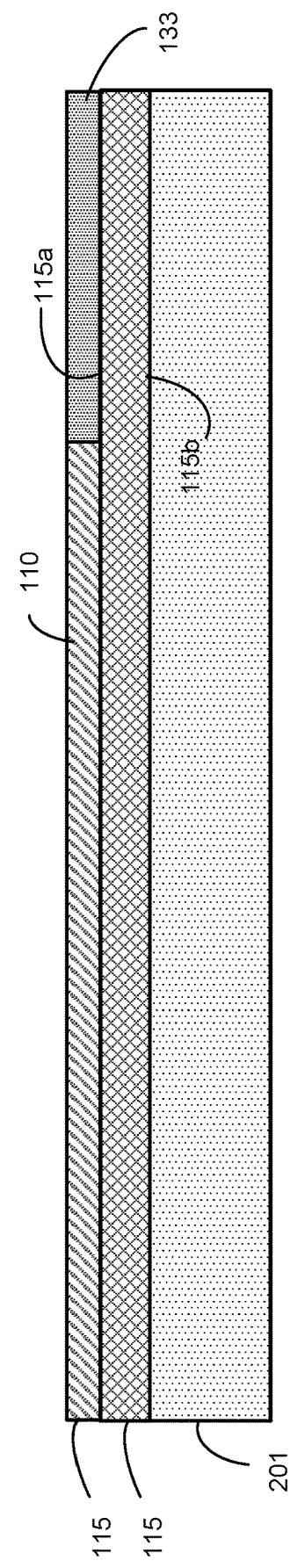

As shown in FIGS. 2B and 2C, and FIG. 8A, at step 820 of process 800, a first layer of conductive material 210 (e.g., molybdenum, aluminum, and/or tungsten) is formed on the first side 115a of the layer of piezoelectric materials 115 using, for example, sputter deposition, and is subsequently patterned to form the first electrode layer 110 using plasma etching or wet chemical etching.

Figure 8D:
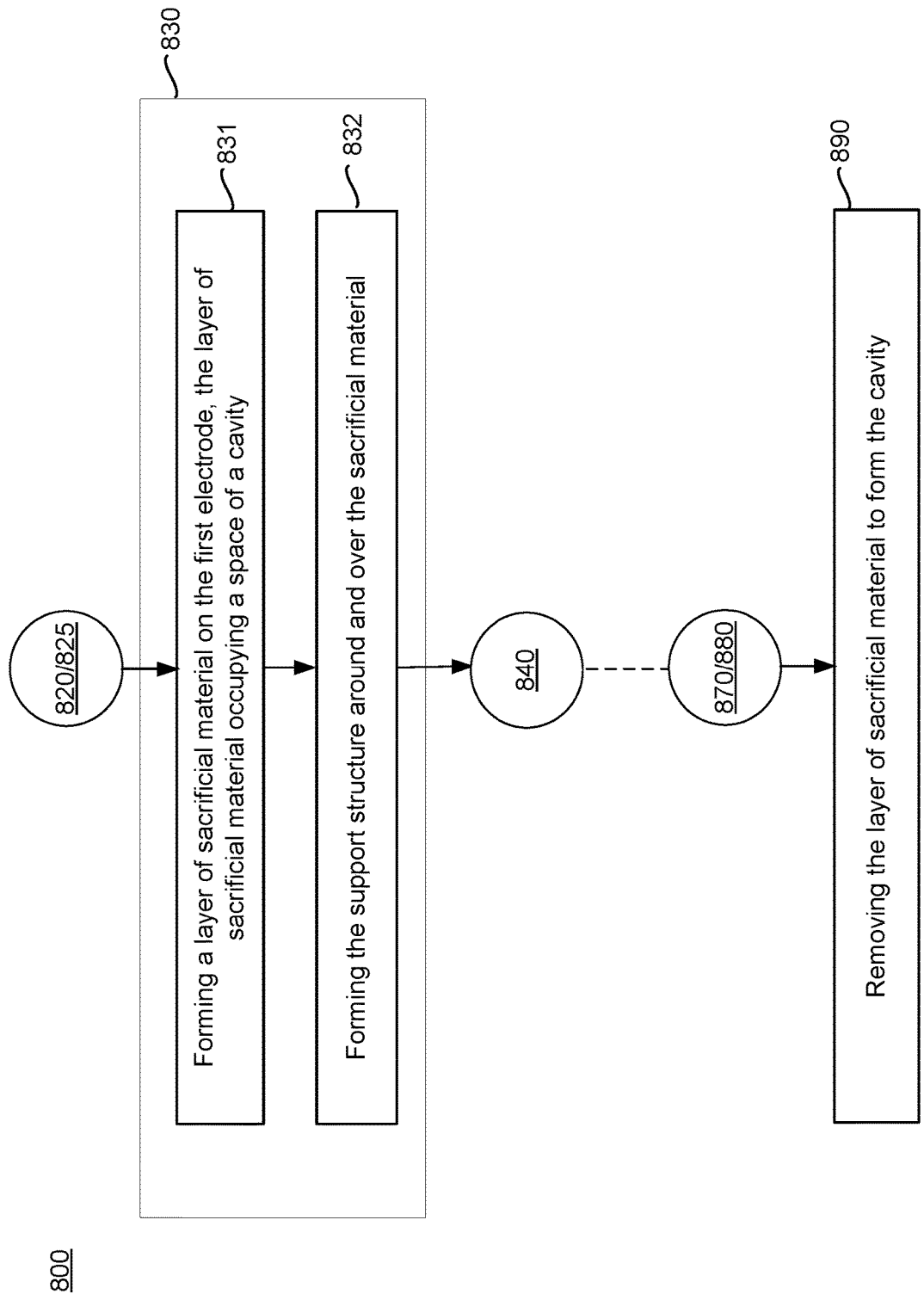

As shown in FIG. 2D, and FIG. 8A, process 800 further includes forming (825) a filler layer 133 adjacent the first electrode layer 110 to provide an even surface 215 together with the first electrode layer 110 for subsequent processing, and forming (830) a support structure 130 on the surrogate substrate 201. As shown in FIG. 2D and FIG. 8D, in some embodiments, forming (830) a support structure 130 includes forming (831) a sacrificial layer 205 on the first electrode layer 110, and forming (832) a support structure around and over the sacrificial layer 205. In some embodiments, the sacrificial layer 205 is formed by depositing a layer of sacrificial material (e.g., silicon dioxide or silicon nitride) using, for example, chemical vapor deposition, on the first electrode layer 110, and subsequently patterned the layer of sacrificial material using, for example, anisotropic reactive ion etching. The sacrificial layer 305 occupies a space that will later become cavity 105. The sacrificial layer 205 is removed later in the process, leaving the cavity 105 in the support structure 130, as discussed further below.

As shown in FIG. 2E, and FIG. 8A, process 800 further includes removing (840) the surrogate substrate 201 using one or more processes, such as chemical mechanical polishing or grinding followed by plasma etching or wet chemical etching, to expose the second side 115b of the layer of piezoelectric material 115. Other methods instead of, or in addition to, chemical mechanical polishing or grinding, and plasma etching or wet chemical etching, may also be used to mechanically remove the surrogate substrate 201 from the piezoelectric layer 115. In some embodiments, part or all of the starter layer or buffer layer (if any) in the layer of piezoelectric material 115 can be removed in the process of removing the surrogate substrate 201.

Figure 2F:
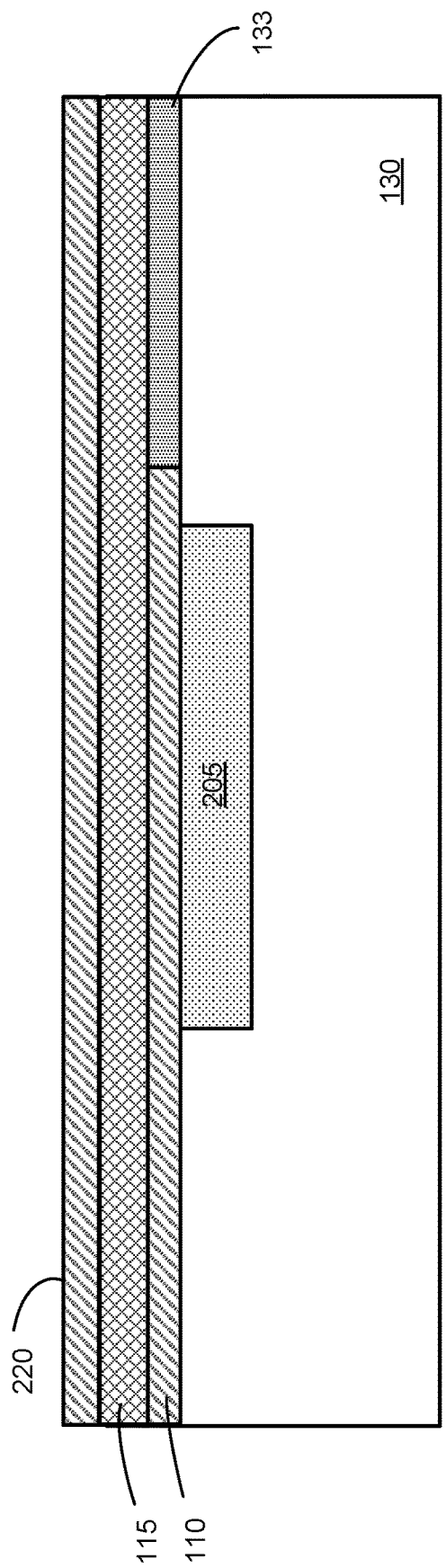
Figure 2G:
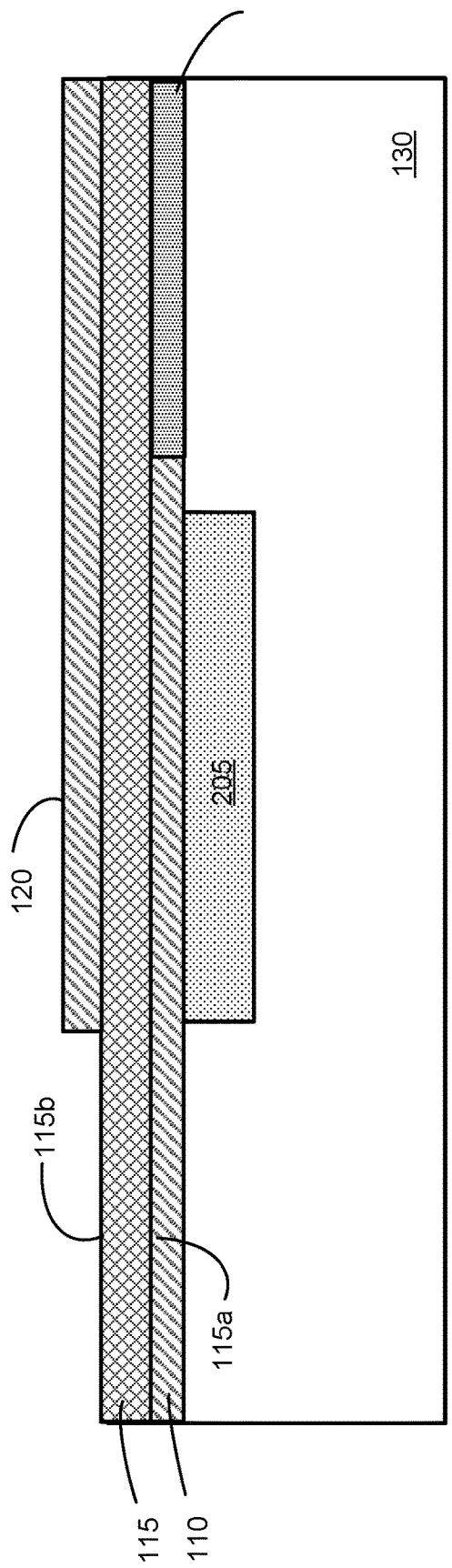

As shown in FIGS. 2F-2G, and FIG. 8A, process 800 further includes forming a second electrode 120 (e.g., molybdenum, aluminum, and/or tungsten) on the second side 115b of the layer of piezoelectric material 115. As shown in FIG. 2F, forming the second electrode 120 includes depositing a second layer of conductive material 220 (e.g., molybdenum, aluminum, and/or tungsten) on the second side of the layer of piezoelectric material 115 using, for example, sputter deposition. As shown in FIG. 2G, forming the second electrode 120 further includes patterning the second layer of conductive material 220, using, for example, plasma etching or wet chemical etching.

Figure 2H:
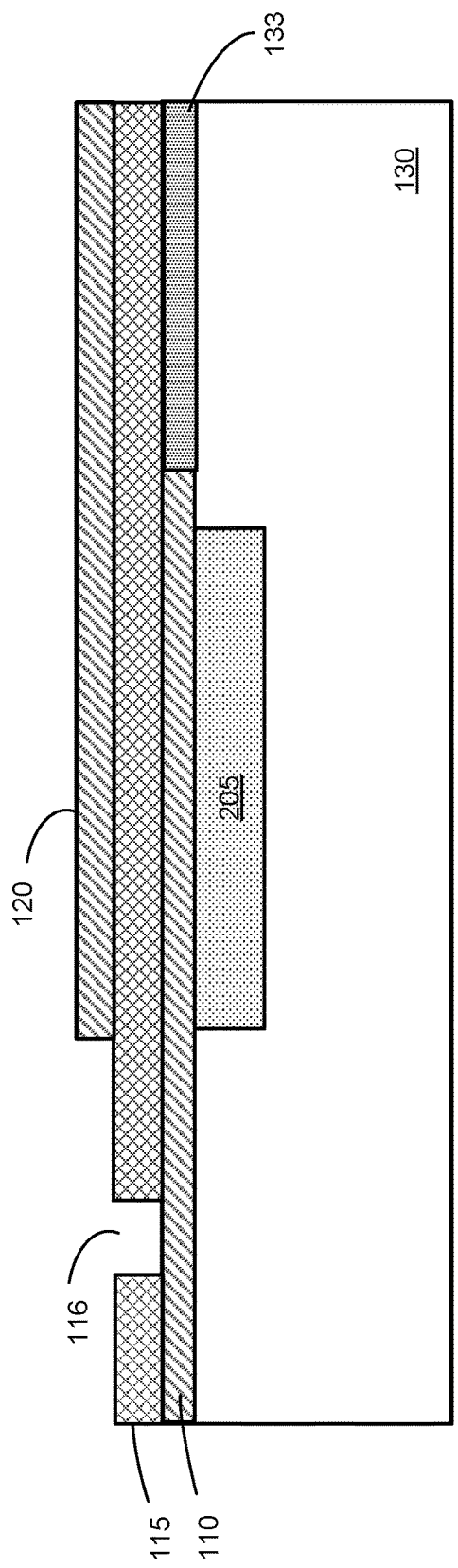
Figure 2I:
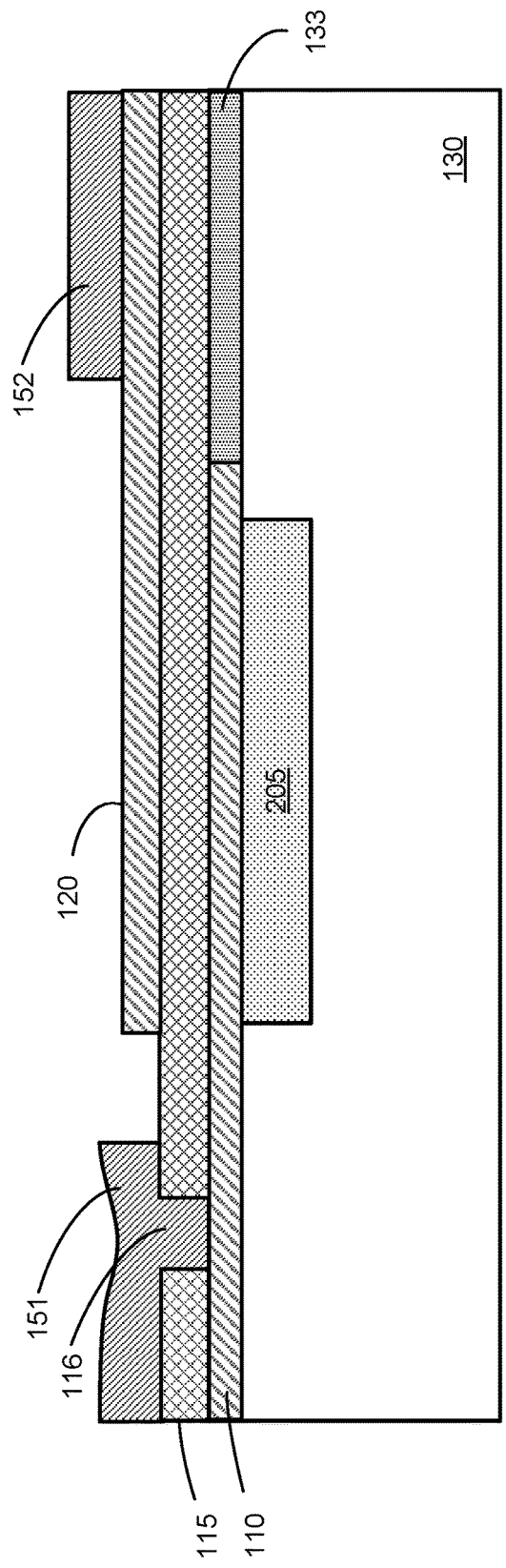

As shown in FIG. 2H and FIG. 8A, process 800 further comprises forming (860) contact hole(s) 116 in the layer of one or more piezoelectric materials. In some embodiments, contact holes 116 are etched in piezoelectric layer 115 using plasma etching to provide access to first electrode 110. As shown in FIG. 2I and FIG. 8A, process 800 further includes forming (870) contacts (e.g., first contact 151 and a second contact 152). In some embodiments, the contacts are formed using conventional processes, such as evaporation deposition, lift-off patterning, or selective electroplating.

Figure 2J:
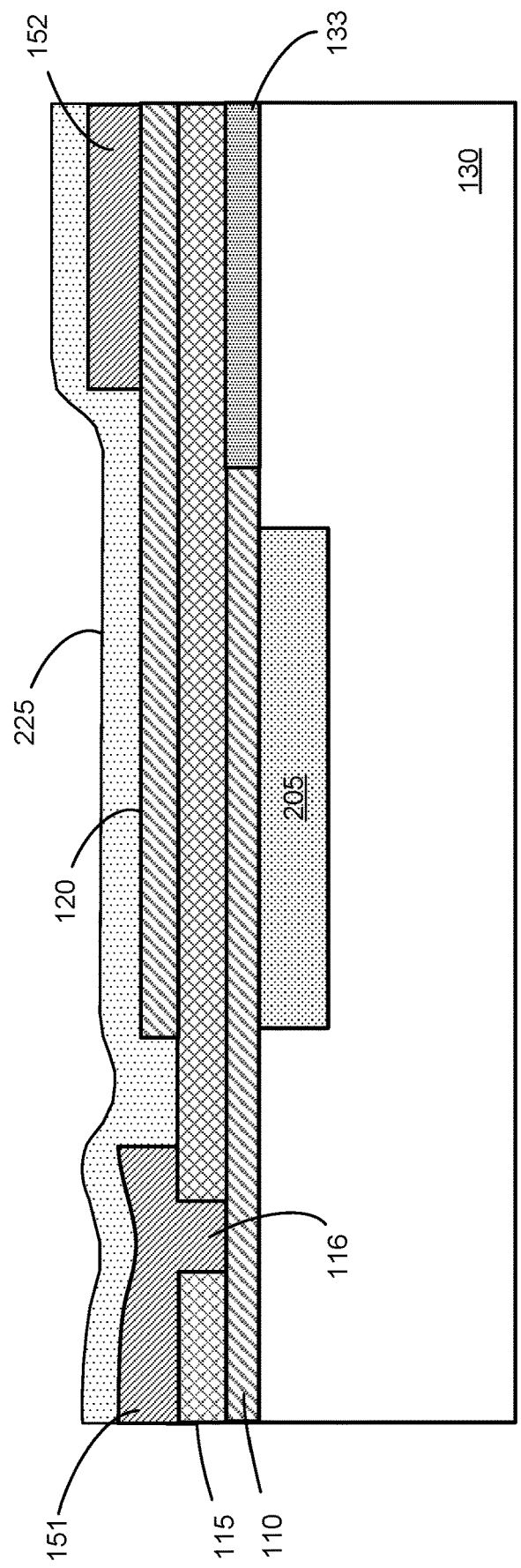

As shown in FIG. 2J and FIG. 8A, process 800 may further include forming (880) one or more additional layers over the BAW resonator (e.g., an optional protective layer 225 for temperature compensation, passivation and frequency trimming).

Figure 2K:
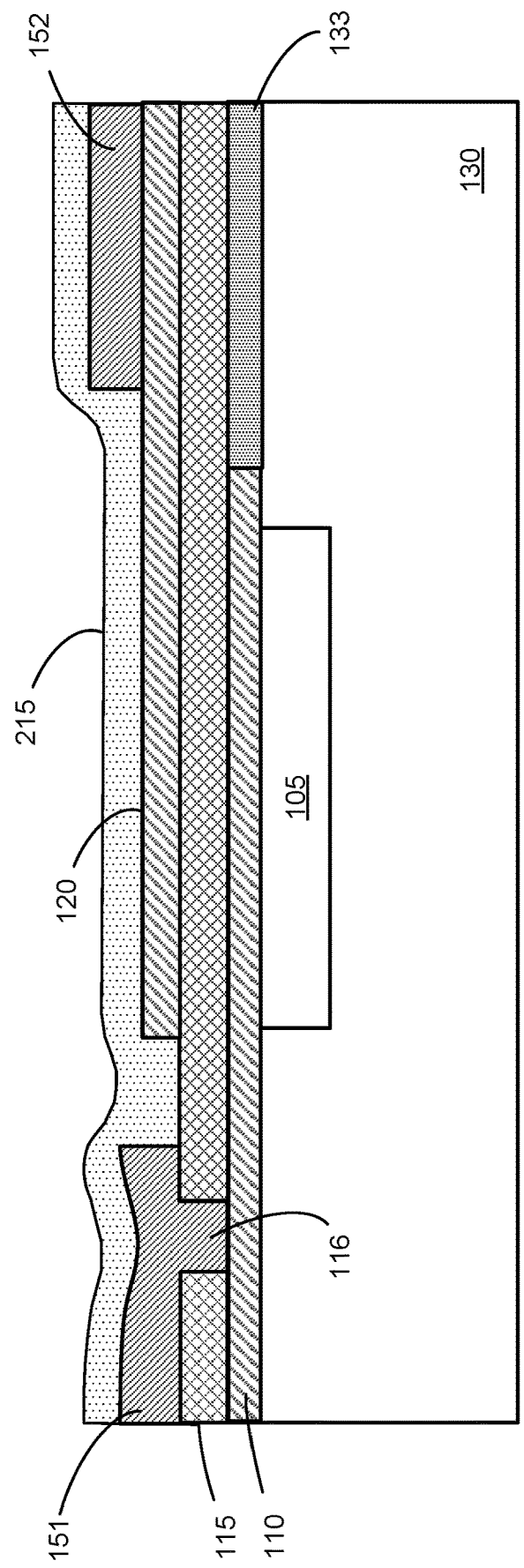

As shown in FIGS. 2K and 8D, process 800 further includes removing (890) the sacrificial layer 205 using, for example chemical (in liquid or vapor phase) etching, resulting in the cavity 105 being formed in BAW resonator 100. In some embodiments, the sacrificial layer 205 can be removed after the support structure 130 is formed. In some embodiments, the sacrificial layer 205 is removed after the protective layer 225 is formed.

Figure 3A:
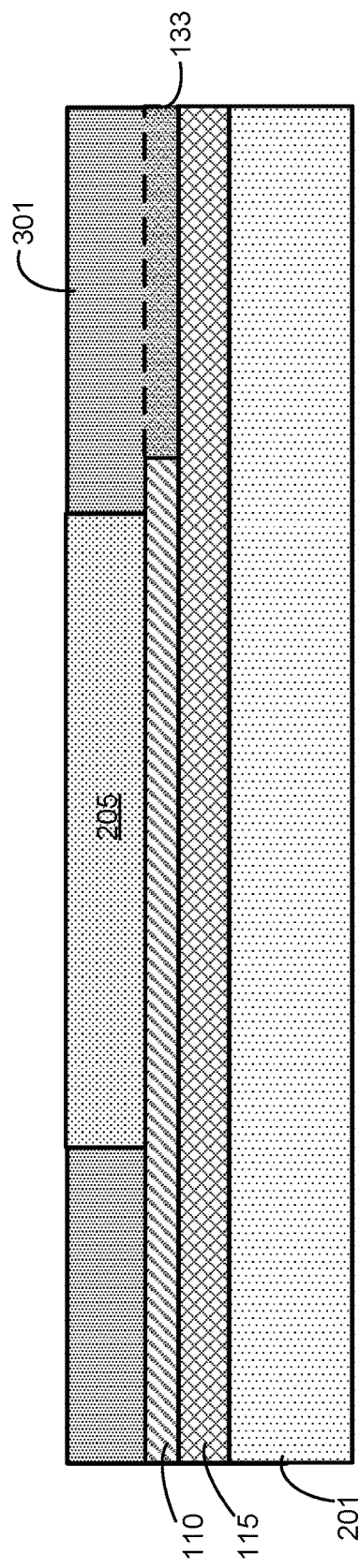
FIGS. 3A-3B are cross-sectional diagrams illustrating forming a support structure in a bulk acoustic wave resonator, in accordance with some embodiments.
Figure 3B:
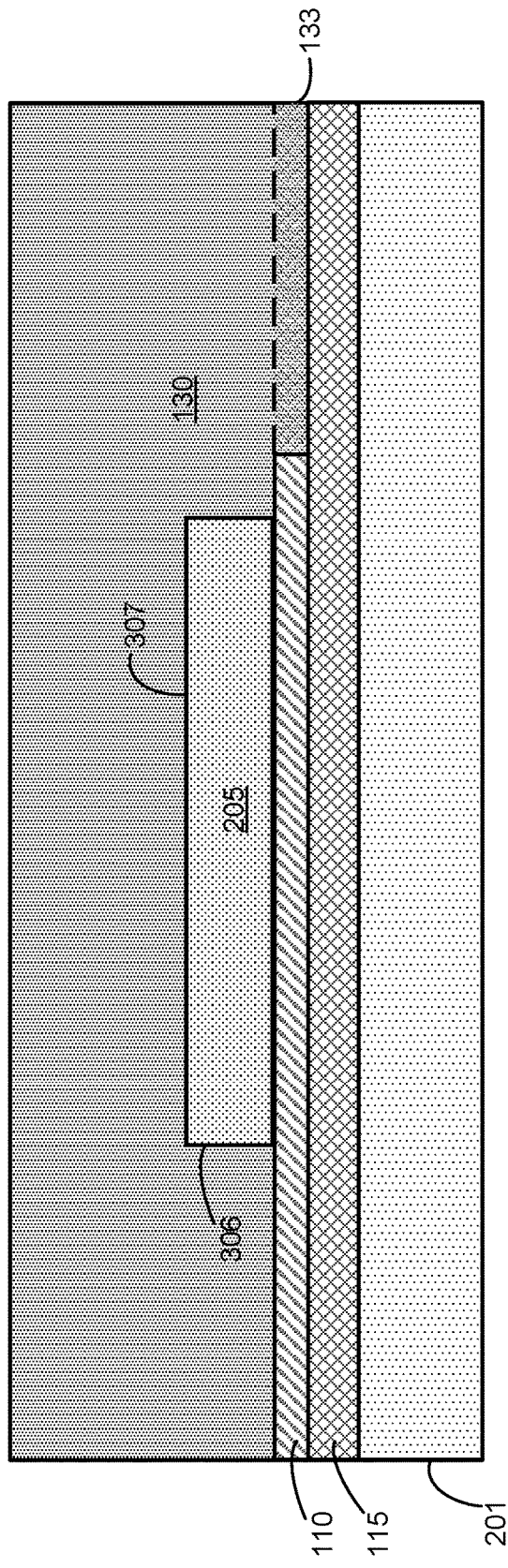

FIGS. 3A-3B illustrate forming (832) the support structure 130 around and over the sacrificial layer 205, in accordance with some embodiments. In some embodiments, the support structure 130 may be formed using one of more processes, such as chemical vapor deposition (CVD), spin-on, taping and/or co-firing, and may include forming a first portion 301 of the support structure 130 around and adjacent sidewalls 306 of the sacrificial layer and forming the rest of the support structure 130 over a top surface 307 of the sacrificial layer and the first portion 301 of the support structure. In some embodiments, the first portion 301 of the support structure includes one or more layers of one or more high resistivity material(s) deposited on the exposed surfaces of the first electrode 110, the sacrificial layer 305, the filler layer 133 or the layer of piezoelectric material 115 using, for example, a chemical vapor deposition (CVD), or spin-on technique. In some embodiments, the rest of the support structure includes one or more layers of high resistivity material(s) deposited over the first portion of the support structure using, for example, chemical vapor deposition (CVD), spin-on, taping and/or co-firing. In some embodiments, the high resistivity material includes a ceramic material (e.g., alumina (Al2O3)). In some embodiments, the one or more high resistivity materials include, for example, any of alumina (Al2O3), polysilicon, Benzocyclobutene (BCB), and/or glass.

Figure 4A:
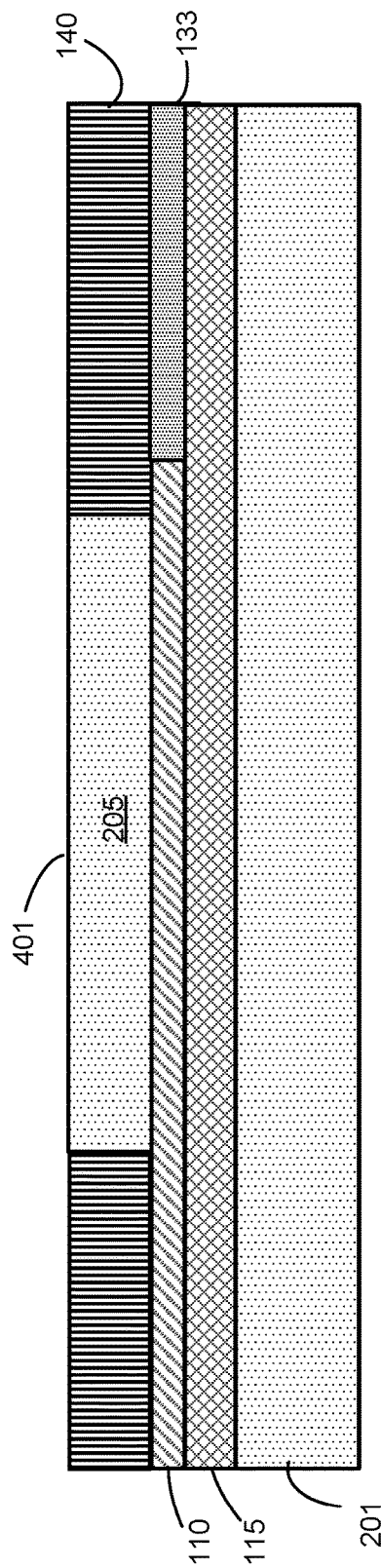
FIGS. 4A-4B are cross-sectional diagrams illustrating forming a support structure in a bulk acoustic wave resonator, in accordance with some embodiments.
Figure 4B:
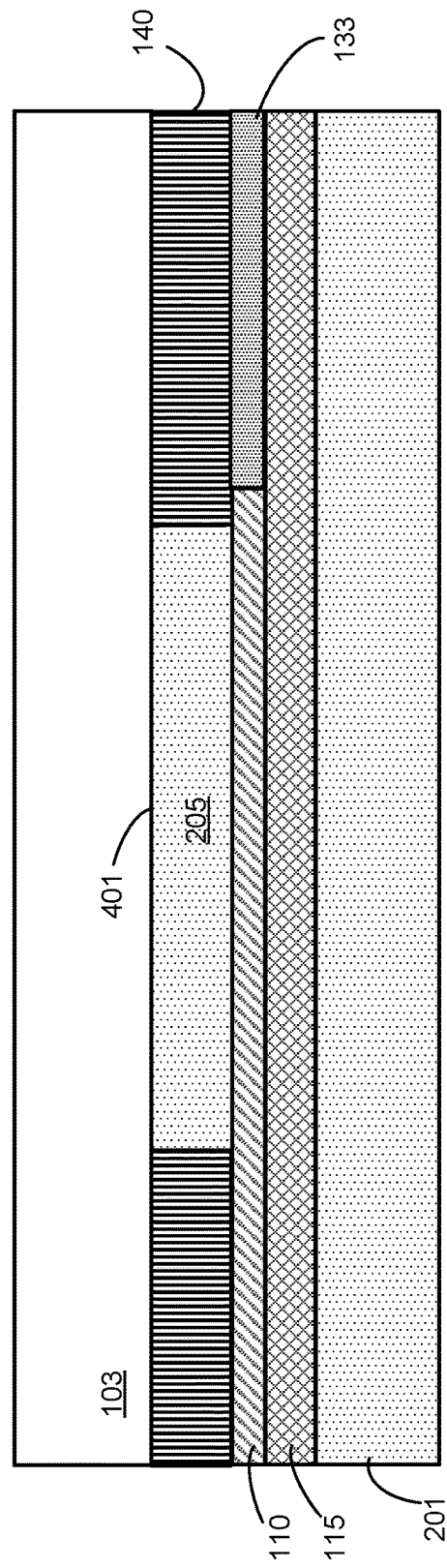
Figure 9A:
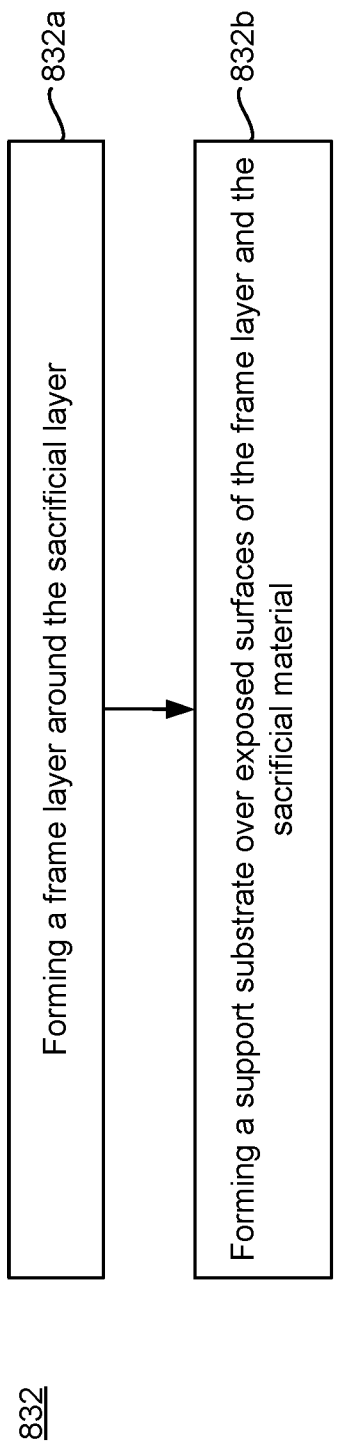

FIGS. 4A-4B in cross-sectional views and FIG. 9A in flowchart form illustrate forming (832) the support structure 130 around and over the sacrificial layer 205, in accordance with some embodiments. As shown, forming (832) the support structure 130 around and over the sacrificial layer 205 includes forming (832a) a frame layer 140 around the layer of sacrificial material 205 by depositing one or more layers of one or more high resistivity materials using, for example, CVD, and by subsequent planarization using, for example, chemical mechanical polishing, to remove any of the one or more high resistivity materials deposited on a top surface 401 of the layer of sacrificial material 205. In some embodiments, the one or more high resistivity materials include, for example, alumina (Al2O3), polysilicon, Benzocyclobutene (BCB), and/or glass.

As shown in FIG. 4B and FIG. 9A, forming (832) the support structure 130 around and over the sacrificial layer 205 further includes forming (832b) a support substrate 103 over the frame layer 140 and the sacrificial layer 205. In some embodiments, the support substrate 103 includes one or more high resistivity materials, such as alumina (Al2O3), silicon (Si), gallium arsenide (GaAs), SiC, sapphire, and/or glass. In some embodiments, the support substrate 103 is formed by depositing one or more layers of one or more high resistivity materials using, for example, CVD spin-on, taping and/or co-firing. In some embodiments, the support substrate 103 is a pre-formed substrate and forming the support substrate 103 over the frame layer 140 includes attaching the support substrate 103 to the frame layer 140 using, for example, a glue material, before or after the sacrificial layer 205 is removed.

Figure 4C:
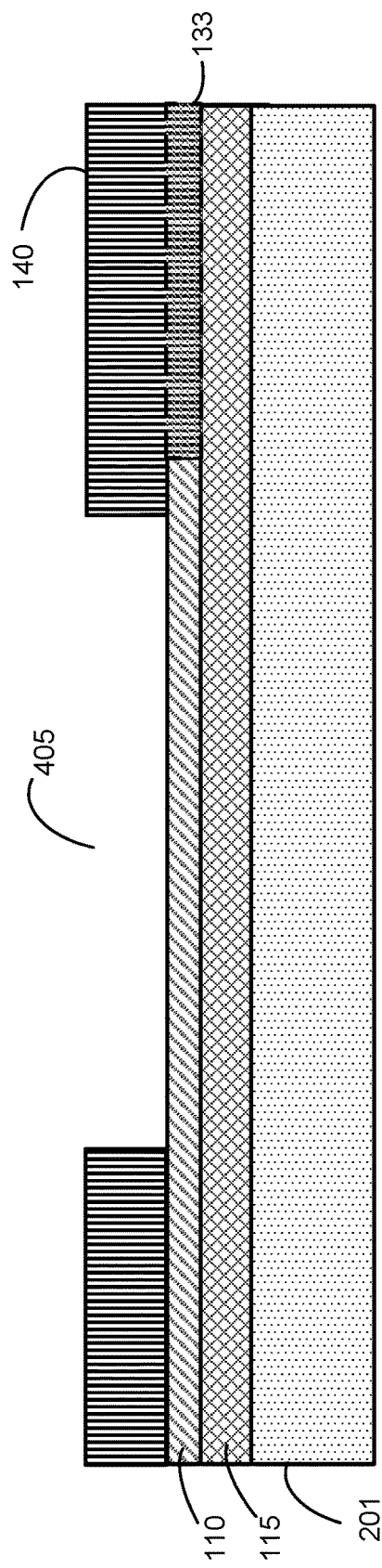
FIGS. 4C-4D are cross-sectional diagrams illustrating forming a support structure in a bulk acoustic wave resonator, in accordance with some embodiments.
Figure 4D:
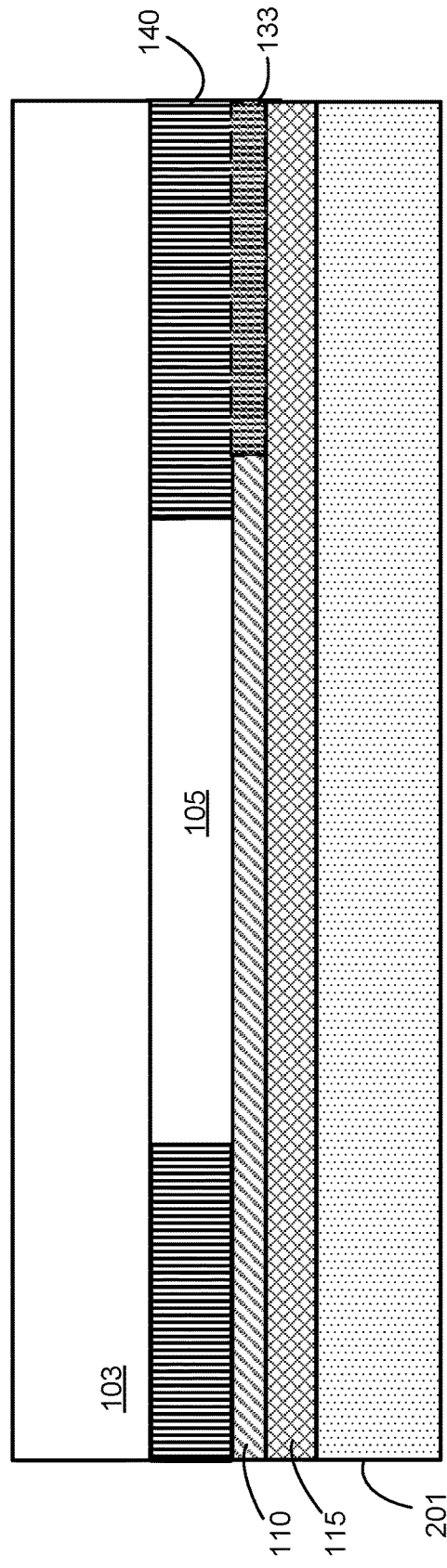
Figure 9B:
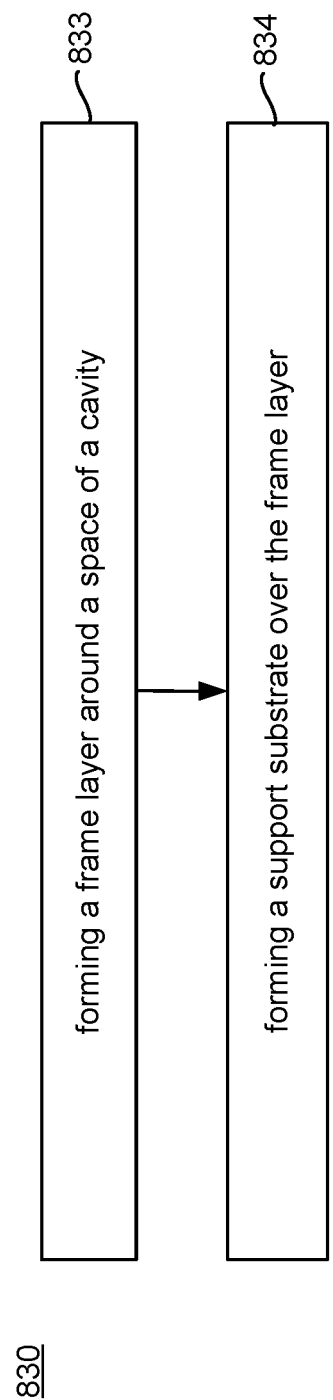

As shown in FIGS. 4C-4D and FIG. 9B, in some embodiments, a sacrificial layer is not used, and forming (830) the support structure 130 over the first electrode layer includes forming (833) a frame layer 140 around a space 405 of the cavity 105 by depositing one or more layers of one or more high resistivity materials using, for example, CVD, spin-on, taping and/or co-firing, and by subsequent patterning of the one or more layers of high resistivity materials using, for example, anisotropic reactive ion etching, to remove a portion of the one or more high resistivity materials in the space 405 of the cavity 105. In some embodiments, the one or more high resistivity materials includes, for example, alumina (Al2O3), polysilicon, Benzocyclobutene (BCB), and/or glass.

As shown in FIG. 4D and FIG. 9B, in some embodiments, forming (830) the support structure 130 over the first electrode layer further includes forming (834) a support substrate 103 over the frame layer 140 and the space 401 of the cavity 105. In some embodiments, the support substrate 103 includes a high resistivity substrate, such as, for example, alumina (Al2O3), gallium arsenide (GaAs), silicon (Si), silicon carbide (SiC), sapphire, and/or glass. In some embodiments, the support substrate 103 is a pre-formed substrate and forming the support substrate 103 over the frame layer 140 includes attaching the support substrate 103 to the frame layer 140 using, for example, a glue material, resulting in the cavity 105 being formed in the support structure 130.

Figure 5A:
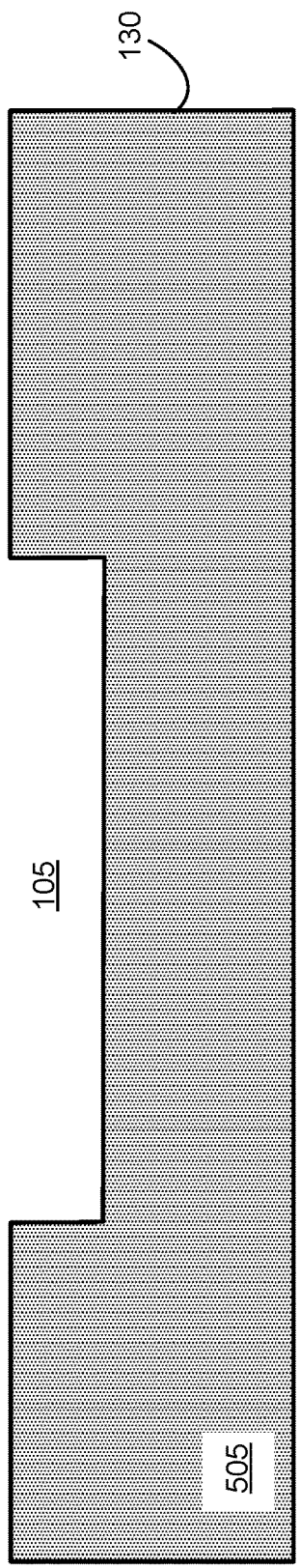
FIGS. 5A-5B are cross-sectional diagrams illustrating forming a support structure in a bulk acoustic wave resonator, in accordance with some embodiment.
Figure 5B:
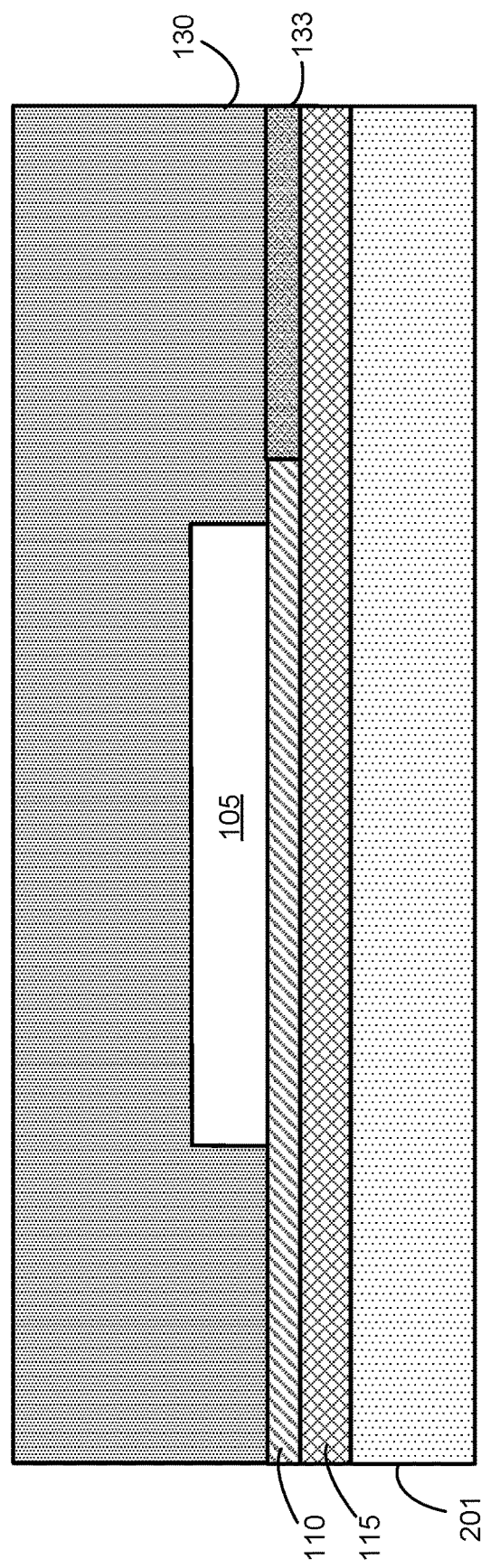
Figure 9C:
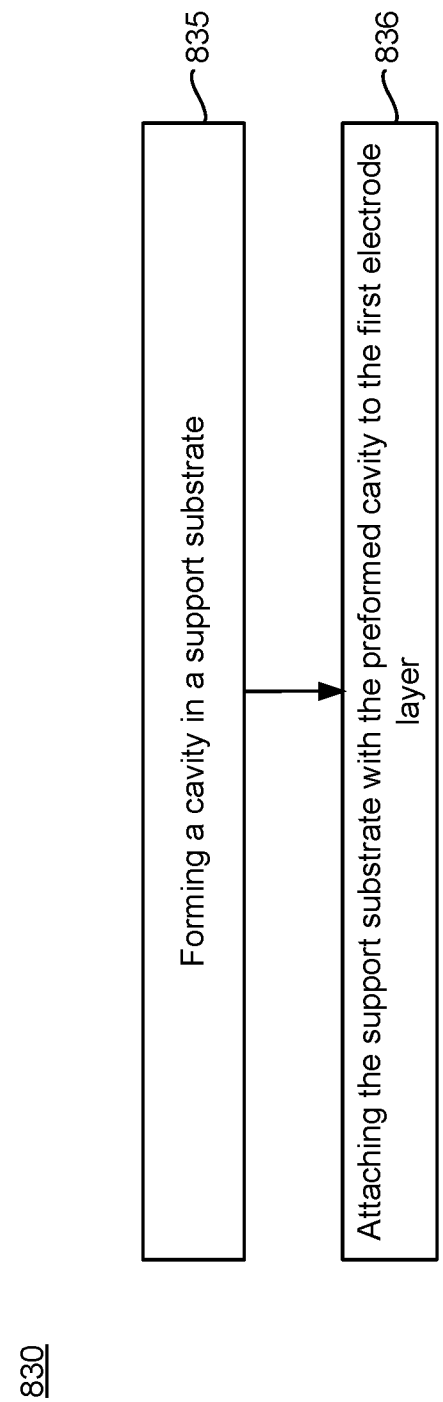

In some embodiments, as shown in FIGS. 5A-5B and FIG. 9C, forming (830) the support structure 130 over the first electrode layer 110 includes forming (835) a cavity 105 in a support substrate 505, and attaching (836) the support substrate with the preformed cavity 105 to the first electrode layer 110 (and the filler layer 133). In some embodiments, the support substrate 505 includes a frame layer 140 and a support substrate 103 combined into one pre-formed substrate, with the cavity etched into the frame layer before the frame layer is attached to the first electrode layer 110 and the filler layer 133.

FIGS. 6A-6D and FIG. 10 illustrate a process 1000 for carrying out step 830 for forming the support structure 130, after forming the first electrode layer 110, in accordance with some embodiments. FIGS. 6A-6D illustrate cross-sectional views of bulk acoustic resonator 100 at various stages of process 1000, in accordance with some embodiments. FIG. 11 is a flowchart representation of process 1000, in accordance with some embodiments.

Figure 6A:
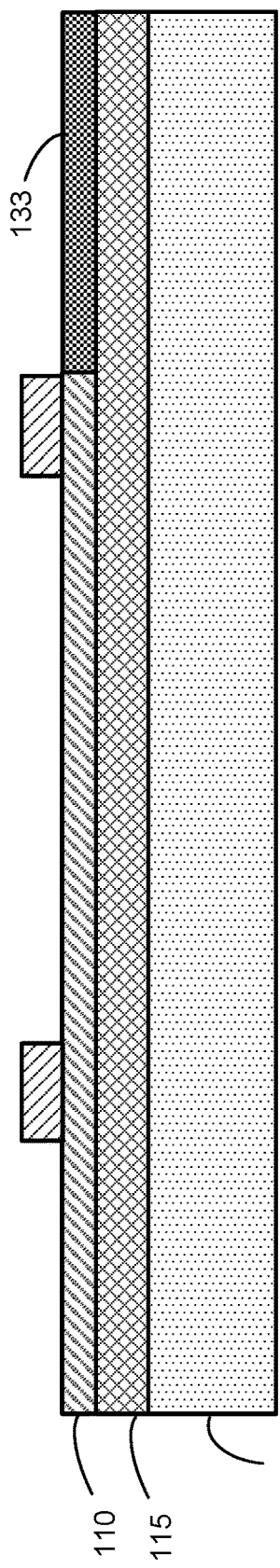
FIGS. 6A-6D are cross-sectional diagrams illustrating a process for forming a support structure including a cavity frame in a bulk acoustic wave resonator, in accordance with some embodiment.
Figure 10:
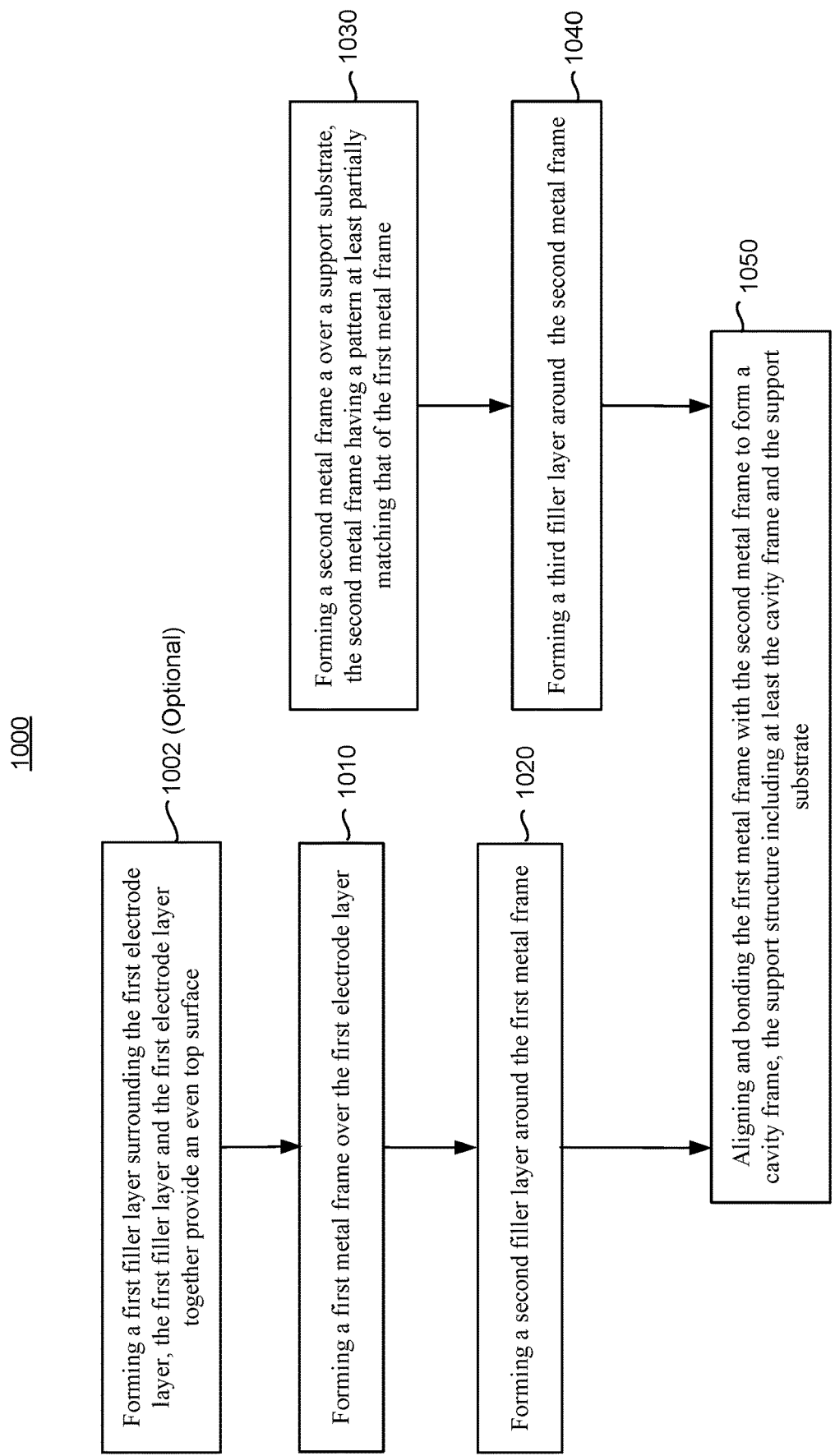
FIG. 10 is a flowchart representation of a process for forming a support structure including a cavity frame in a bulk acoustic wave resonator, in accordance with some embodiment.
Figure 11:
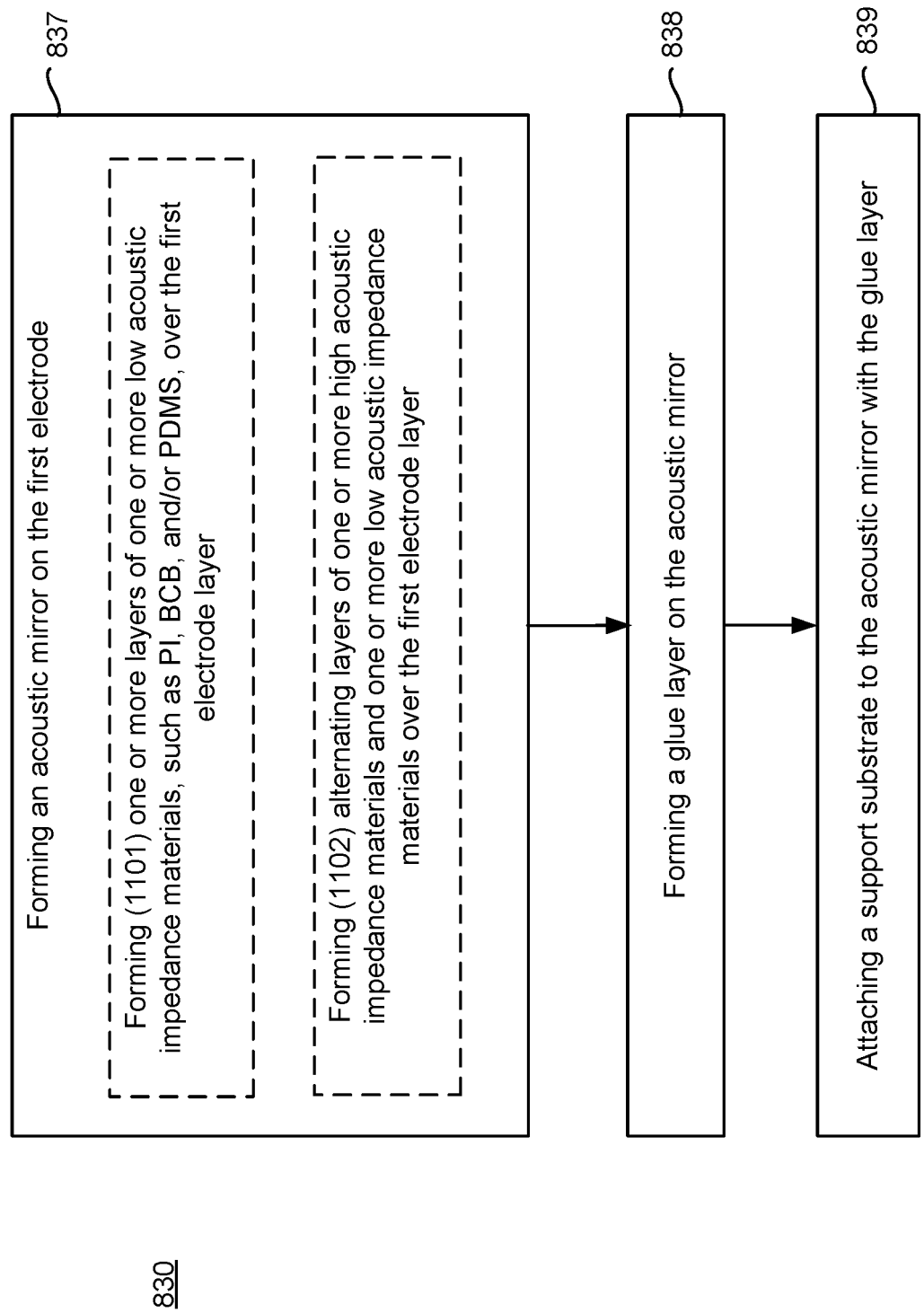
FIG. 11 is a flowchart representation of a process for forming a support structure including an acoustic mirror in a bulk acoustic wave resonator, in accordance with some embodiment.

As shown in FIG. 6A and FIG. 10, at an optional step 1002 of process 1000, an optional filler layer 133 surrounding the first electrode layer 110 is formed to provide an even surface with the first electrode layer 110 for subsequent processing. At step 1010 of process 1000, a first metal frame 131 is formed over the first electrode 110 using one or more processes, such as, for example, evaporation deposition combined with lift-off patterning or selective electroplating.

Figure 6B:
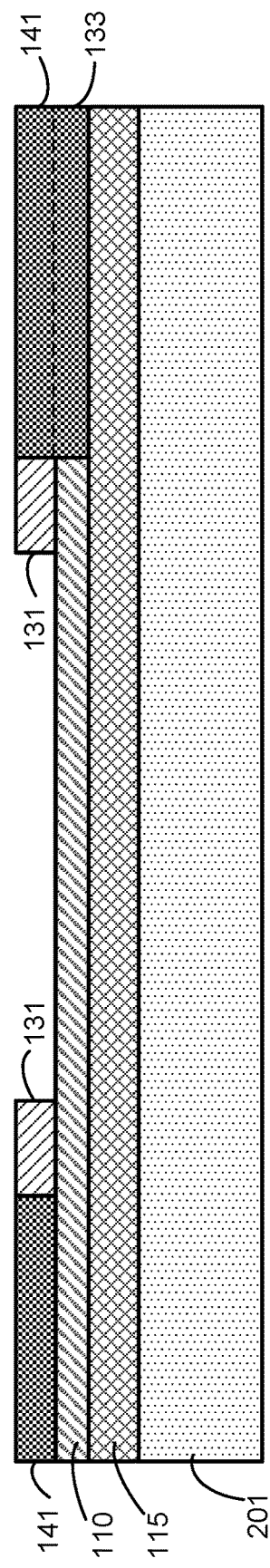

As shown in FIG. 6B and FIG. 10, at step 1020 of process 1000, a second filler layer 141 around the first metal frame is formed on the surrogate substrate 201 (e.g., filling the exterior or outer spaces on the surrogate substrate 201 created by the formed first metal frame 131 over the first electrode 110.) In some embodiments, second filler layer 141 includes a polymer material such as polyimide, and second filler layer 141 is formed using spin coating or fluid ejection, which may be followed by, for example, photolithography.

Figure 6C:
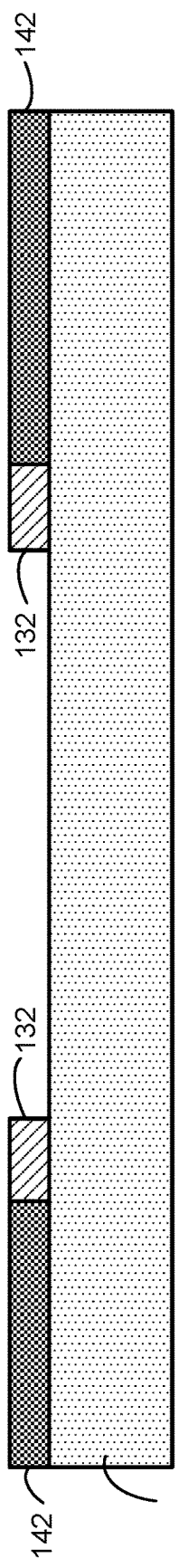
Figure 6D:
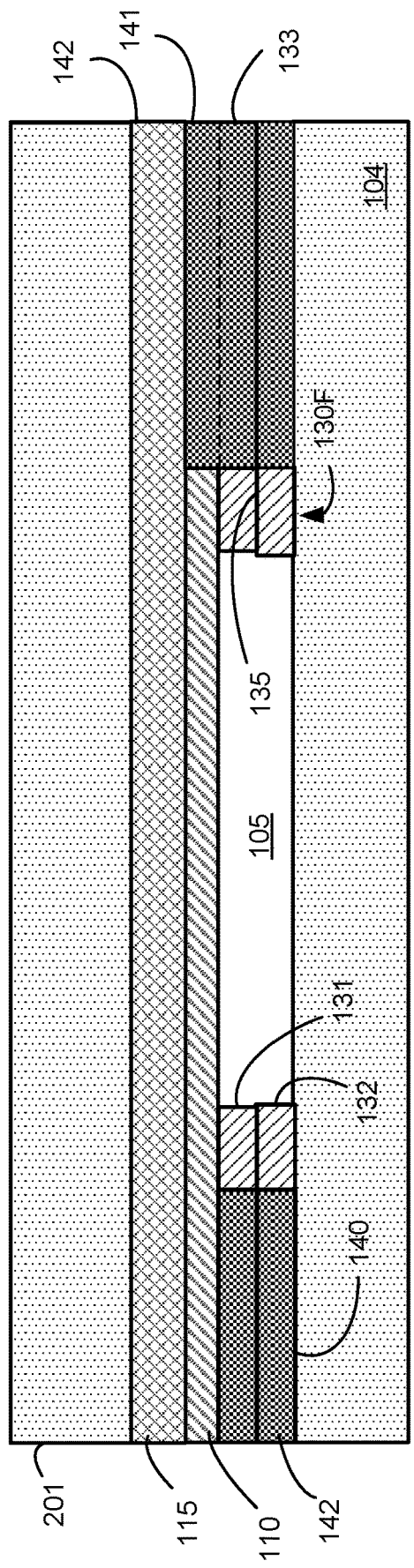

As shown in FIG. 6C and FIG. 10, at step 1030 of process 1000, a second metal frame 132 is formed over a support substrate 104 using one or more processes, such as, for example, evaporation deposition and lift-off patterning or selective electroplating. At step 1040, a third filler layer 142 around the second metal frame 132 is formed on the support substrate 104 (e.g., filling the exterior or outer spaces on the second substrate 101 created by the formed second metal frame 132 over the second substrate 101.) In some embodiments, the third filler layer 142 includes a polymer material such as polyimide, and can be formed using spin coating or fluid ejection, which may be followed by, for example, photolithography As shown in FIG. 6D and FIG. 10, at step 1050 of process 1000, the first metal frame 131 is aligned and bonded with the second metal frame 132 to form a cavity frame 130F. In some embodiments, the first metal frame 131 and the second metal frame 132 are bonded using a solid phase metal-to-metal bonding process to form a metal-to-metal bond 135 between the first metal frame 131 and the second metal frame 132. Thus, the first electrode 110, the cavity frame 130, and the second substrate 101 together define a cavity 105 under the first electrode 110. Subsequently, the surrogate substrate 201 is removed, as discussed above.

Figure 7D:
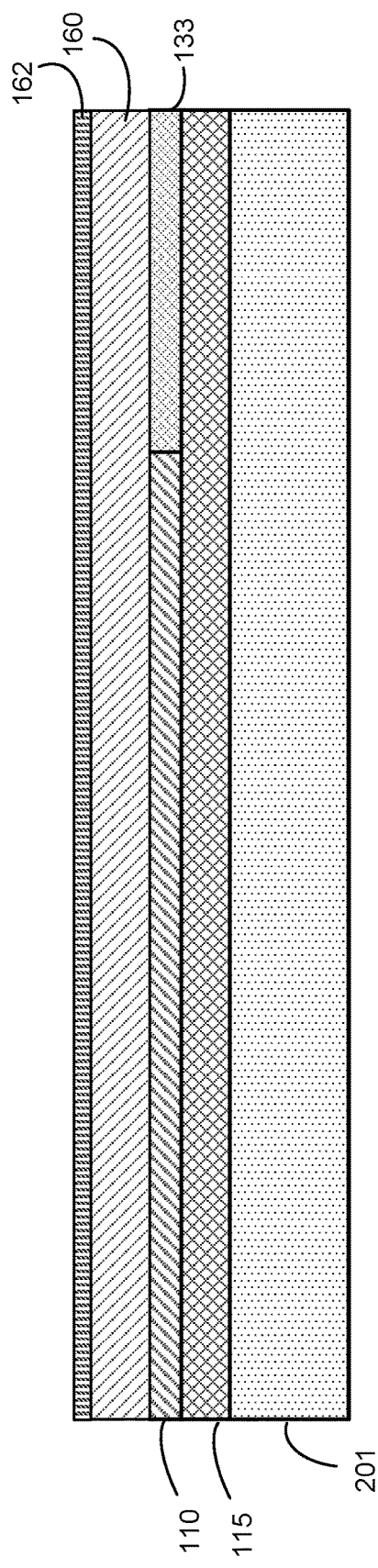
Figure 7E:
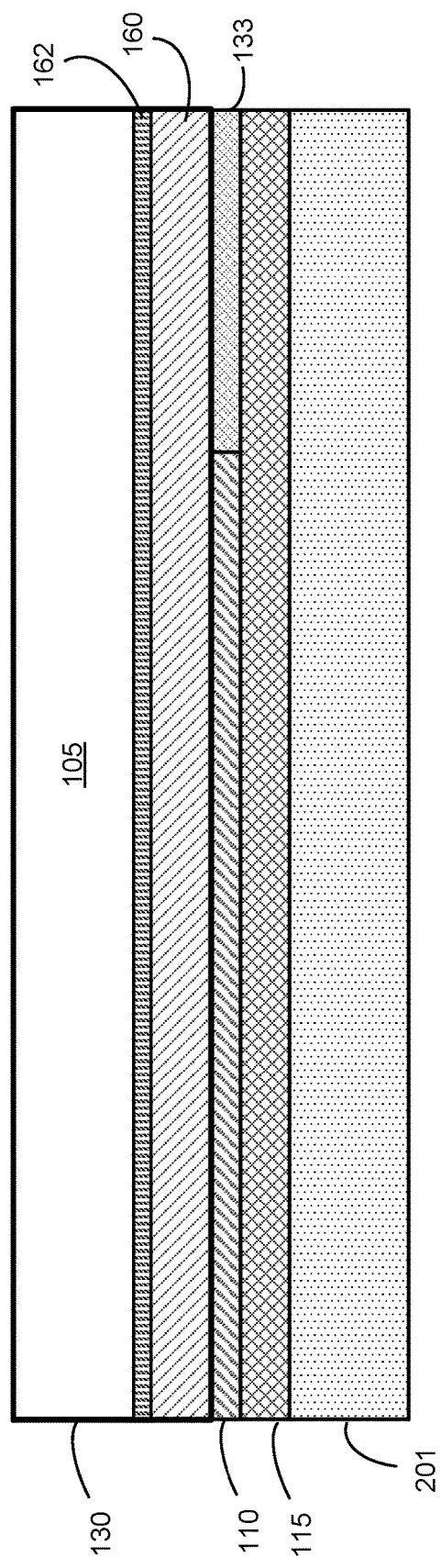

FIGS. 7A and 7D-7E in cross-sectional views and FIG. 11 in flowchart form illustrate forming (830) the support structure 130 over the first electrode layer in accordance with some embodiments, including forming (837) an acoustic mirror 160 on the first electrode (as shown in FIG. 7A), forming (838) a glue layer 162 on the acoustic mirror (as shown in FIG. 7D), and attaching (839) a support substrate 105 to the acoustic mirror 160 using the glue layer 162 (as shown in FIG. 7E). In some embodiments, as shown in FIG. 7B, forming (837) an acoustic mirror 160 over the first electrode layer comprises forming (1101) one or more layers (e.g., layer(s) 160a and/or 160b) of one or more low acoustic impedance (low-Z) materials, such as polyimide (PI), Benzocyclobutene (BCB), and polydimethylsiloxane (PDMS), over the first electrode layer using, for example, evaporation, sputtering, CVD, and/or spin-on. In some embodiments, as shown in FIG. 7C, forming (837) an acoustic mirror includes forming (1102) alternating layers of one or more high acoustic impedance materials and one or more low acoustic impedance materials over the first electrode layer using, for example, evaporation, sputtering, CVD, and/or spin-on.

For example, as shown in FIG. 7C, the alternating layers include layers 160-1, 160-3, 160-5, and 160-7 of one or more high acoustic impedance materials and layers 160-2, 160-4, 160-6, and 160-8 of one or more low acoustic impedance materials, alternatingly formed in the order of 160-1, 160-2, 160-3, 160-4, 160-5, 160-6, 160-7 and 160-8, such that layer 160-1 is formed on the first electrode layer 110, layer 160-2 is formed on layer 160-1, layer 160-3 is formed on layer 160-2, and so forth. As a result, each of the layers 160-1, 160-3, 160-5, and 160-7 is adjacent to one or more of the layers 160-2, 160-4, 160-6, and 160-8 but not to any of the layers 160-1, 160-3, 160-5, and 160-7.

In some embodiments, as shown in FIG. 7C, each layer of the multilayer structure has a thickness $\tau$ equal to about one quarter wavelength of a resonance frequency of the bulk acoustic resonator 100A. In practice, the alternating layers can include more or less layers than those shown in FIG. 7C as an example. In some embodiments, the one or more high acoustic impedance materials can include tungsten (W), Gold (Au), Tantalum (Ta), Molybdenum (Mo), and/or Ruthenium (Ru), and the one or more low acoustic impedance materials can include silicon dioxide (SiO2) and/or silicon nitride (SiN).

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A bulk acoustic resonator, comprising:
    a piezoelectric layer having a first side and a second side opposite to the first side, the piezoelectric layer including one or more sublayers of one or more piezoelectric materials epitaxially grown on a surrogate substrate that has been removed, wherein the second side of the piezoelectric layer is in contact with the surrogate substrate prior to removal of the surrogate substrate;
    a first electrode layer formed on the first side of the piezoelectric layer;
    a support structure on the first side of the piezoelectric layer, the support structure including a cavity adjacent the first electrode layer; and
    a second electrode layer formed on the second side of the piezoelectric layer;
    wherein the support structure includes a cavity frame and a support substrate, the cavity frame including:
        a first metal frame formed on the first electrode layer; and
        a second metal frame formed on the support substrate and bonded with the first metal frame via metal-to-metal bonding, the second metal frame having a pattern at least partially matching that of the first metal frame.

2. The bulk acoustic resonator of claim 1, wherein the piezoelectric layer includes one or more single-crystalline piezoelectric materials epitaxially grown from the second side to the first side on the surrogate substrate that has been removed.

3. The bulk acoustic resonator of claim 2, wherein the piezoelectric layer includes a multilayer structure of piezoelectric materials, the multilayer structure including a first sublayer of a first piezoelectric material at the second side and a second sublayer of a second piezoelectric material at the first side, the first sublayer being epitaxially grown on the surrogate substrate that has been removed, and the second sublayer being epitaxially grown over the first sublayer.

4. The bulk acoustic resonator of claim 1, wherein the first electrode layer is deposited on the first side of the piezoelectric layer, and wherein the second electrode layer is deposited on the second side of the piezoelectric layer.

5. The bulk acoustic resonator of claim 1, wherein the support substrate includes one or more layers of one or more high resistivity materials.

6. The bulk acoustic resonator of claim 5, wherein the one or more high resistivity materials include one or more ceramic materials.

7. The bulk acoustic resonator of claim 5, wherein the one or more high resistivity materials include one or more materials selected from the group consisting of aluminum oxide ($Al_2O_3$), polysilicon, benzocyclobutene (BCB), and glass.

8. The bulk acoustic resonator of claim 5, wherein the support structure further includes a frame layer surrounding the cavity, and the support substrate is adjacent the frame layer and the cavity, the frame layer including one or more layers of one or more high resistivity materials selected from the group consisting of: aluminum oxide or alumina ($Al_2O_3$), polysilicon, and/or benzocyclobutene (BCB), the support substrate including one or more layers of one or more high resistivity materials selected from the group consisting of alumina ($Al_2O_3$), gallium arsenide (GaAs), silicon (Si), silicon carbide (SiC), sapphire, and glass.

9. The bulk acoustic resonator of claim 8, wherein the support substrate is attached to the frame layer by a glue material.

10. The bulk acoustic resonator of claim 1, wherein the support substrate is attached to the first electrode layer, the support substrate including one or more materials selected from the group consisting of high-resistivity aluminum oxide ($Al_2O_3$), silicon (Si), gallium arsenide (GaAs), silicon carbide (SiC), sapphire, and glass, and wherein the support substrate has a cavity etched therein before the support substrate is attached to the first electrode layer.

11. A bulk acoustic resonator, comprising:
    a piezoelectric layer having a first side and a second side opposite to the first side, the piezoelectric layer including one or more sublayers of one or more single-crystalline piezoelectric materials;
    a first electrode layer formed on the first side of the piezoelectric layer;
    a support structure on the first side of the piezoelectric layer, the support structure including:
        a support substrate;
        a cavity adjacent the first electrode layer that extends from the support substrate to the first electrode;
        a frame surrounding the cavity, wherein the support substrate is adjacent the frame and the cavity and the frame extends from the support substrate to the first electrode; and
    a second electrode layer formed on the second side of the piezoelectric layer;

wherein the frame includes:
a first metal frame formed on the first electrode layer, and
a second metal frame formed on the support structure and bonded with the first metal frame via metal-to-metal bonding, the second metal frame having a pattern at least partially matching that of the first metal frame.

12. The bulk acoustic resonator of claim 11, wherein the support substrate includes one or more layers of one or more high resistivity materials.

* * * * *